(12) United States Patent
Nelson

(10) Patent No.: US 10,998,165 B2
(45) Date of Patent: May 4, 2021

(54) ION PLASMA DISINTEGRATOR

(71) Applicant: Bradley Nelson, Kings Park, NY (US)

(72) Inventor: Bradley Nelson, Kings Park, NY (US)

( * ) Notice: Subject to any disclaimer, the term of this patent is extended or adjusted under 35 U.S.C. 154(b) by 0 days.

(21) Appl. No.: 16/893,798

(22) Filed: Jun. 5, 2020

(65) Prior Publication Data
US 2020/0303160 A1 Sep. 24, 2020

Related U.S. Application Data

(63) Continuation-in-part of application No. 15/230,662, filed on Aug. 8, 2016, now Pat. No. 10,675,633.

(51) Int. Cl.
*B23K 10/00* (2006.01)
*H01J 37/24* (2006.01)
*H01J 37/32* (2006.01)

(52) U.S. Cl.
CPC ...... *H01J 37/241* (2013.01); *H01J 37/32064* (2013.01); *H01J 37/3266* (2013.01); *H01J 2237/2449* (2013.01)

(58) Field of Classification Search
CPC ............... H01J 37/241; H01J 37/32064; H01J 11/3266; H01J 2237/2449; H05H 1/34; H05H 1/50; H05H 1/48; B20C 19/18; B02B 3/0083

USPC .... 219/121.36, 121.39, 121.48, 121.52, 506, 219/494, 121.42, 121.54
See application file for complete search history.

(56) References Cited

U.S. PATENT DOCUMENTS

| | | | | |
|---|---|---|---|---|
| 3,780,675 A | * | 12/1973 | Frye | F23G 5/085 110/215 |
| 4,376,373 A | * | 3/1983 | Weber | B01D 53/34 60/648 |
| 4,644,877 A | | 2/1987 | Barton et al. | |
| 5,958,264 A | | 9/1999 | Tsantrizos et al. | |
| 6,057,524 A | | 5/2000 | Kaatooka et al. | |
| 6,444,944 B2 | | 9/2002 | Schneider et al. | |
| 7,101,518 B1 | | 9/2006 | Ko | |
| 8,888,030 B2 | | 11/2014 | Zhang | |
| 9,121,605 B2 | | 9/2015 | Carabin et al. | |

* cited by examiner

*Primary Examiner* — Mark H Paschall
(74) *Attorney, Agent, or Firm* — Steven A. Nielsen; www.NielsenPatents.com

(57) ABSTRACT

An electronic device incorporating a high voltage power supply connected to a pair of metal plates spaced to maintain a continuous high current arc of electricity creating an Ion Plasma discharge for the purpose of vaporizing documents placed between the plates. Magnetic containment coils around the outside of the metal plates are phase synchronized to the magnetic field created by the Ion Plasma arc to maintain the position of the arc between the plates and to direct the position of the arc in a predetermined pattern to search for any material between the plates that has not been disintegrated.

23 Claims, 12 Drawing Sheets

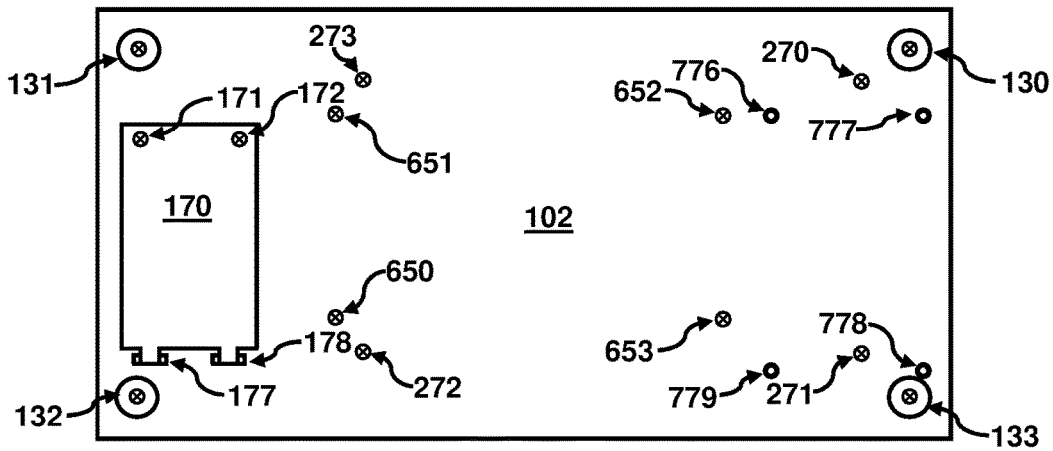
FIG. 8
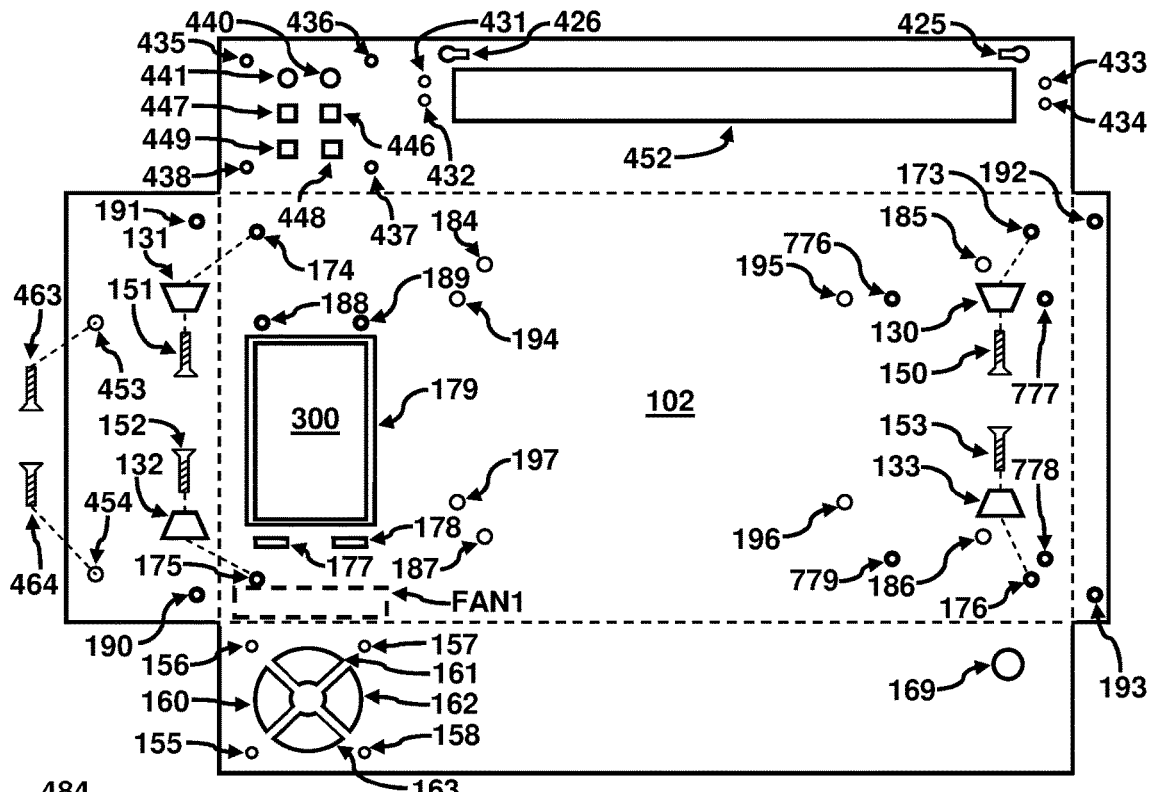
FIG. 9
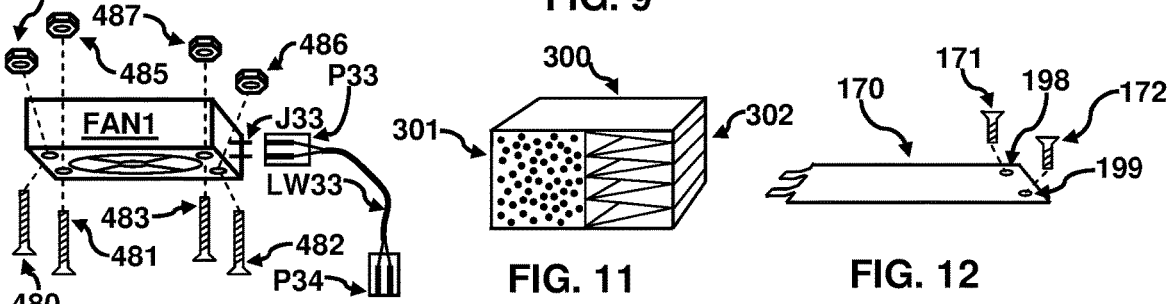
FIG. 10
FIG. 11
FIG. 12

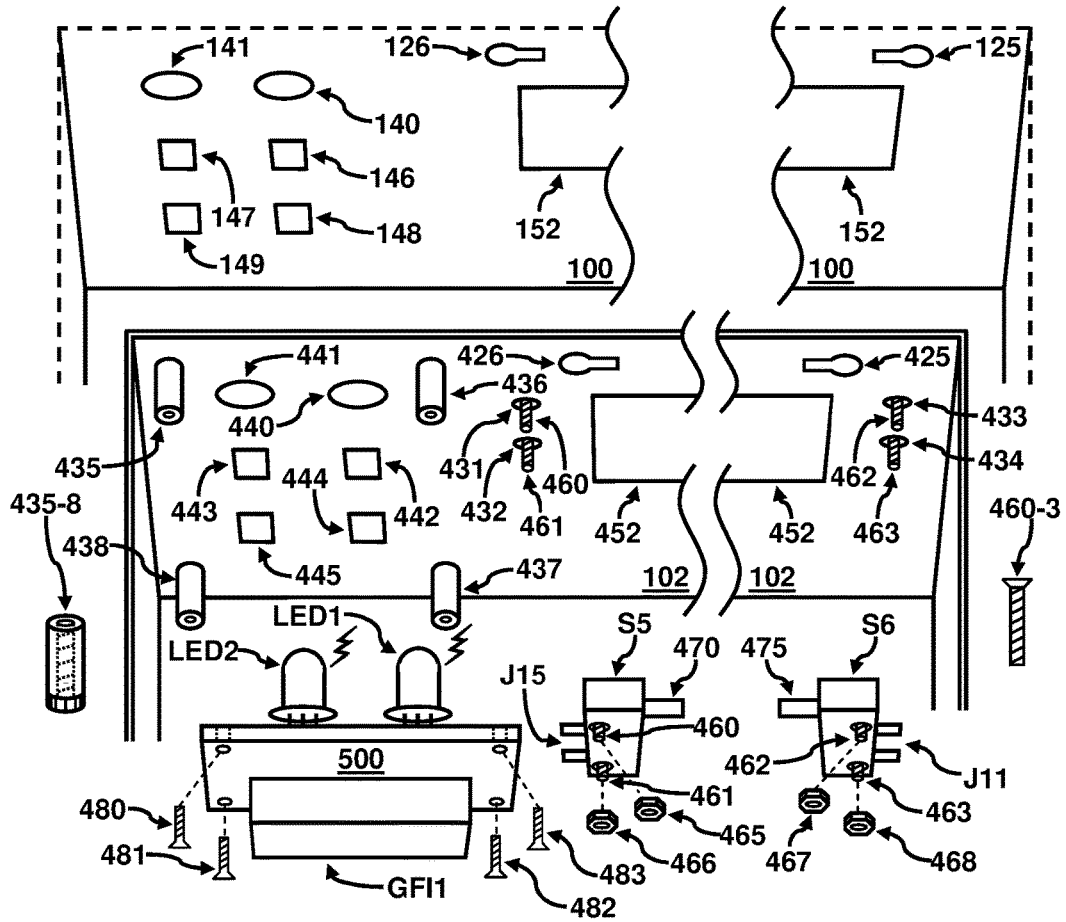
FIG. 26
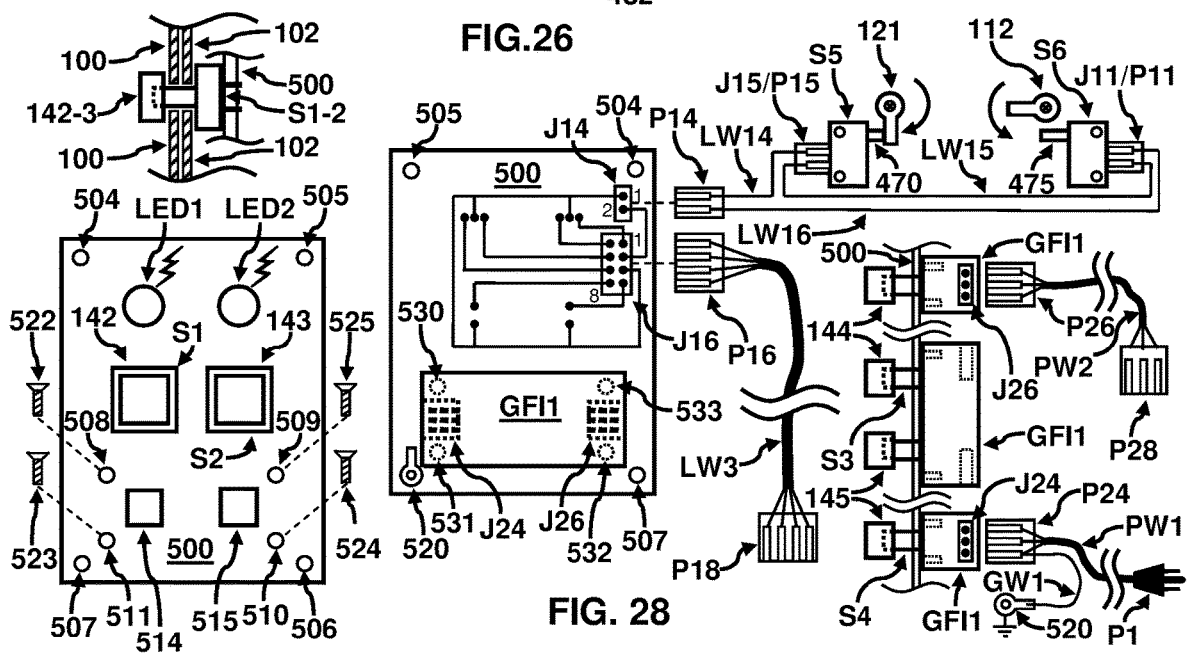
FIG. 27
FIG. 28
FIG. 29

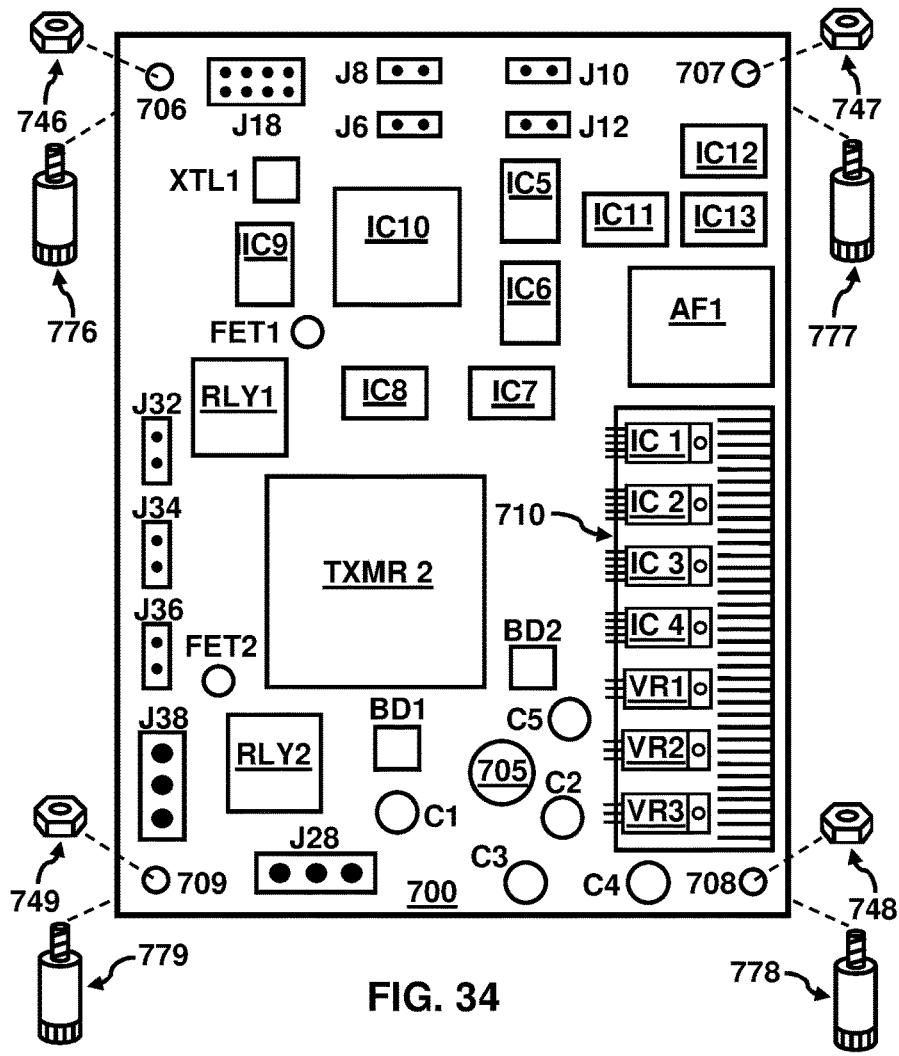
FIG. 34
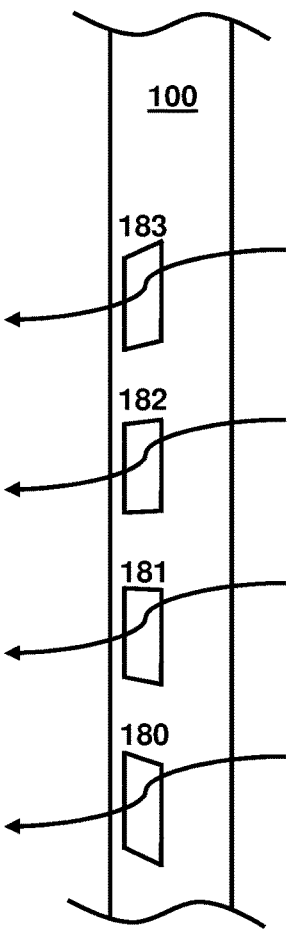
FIG. 35
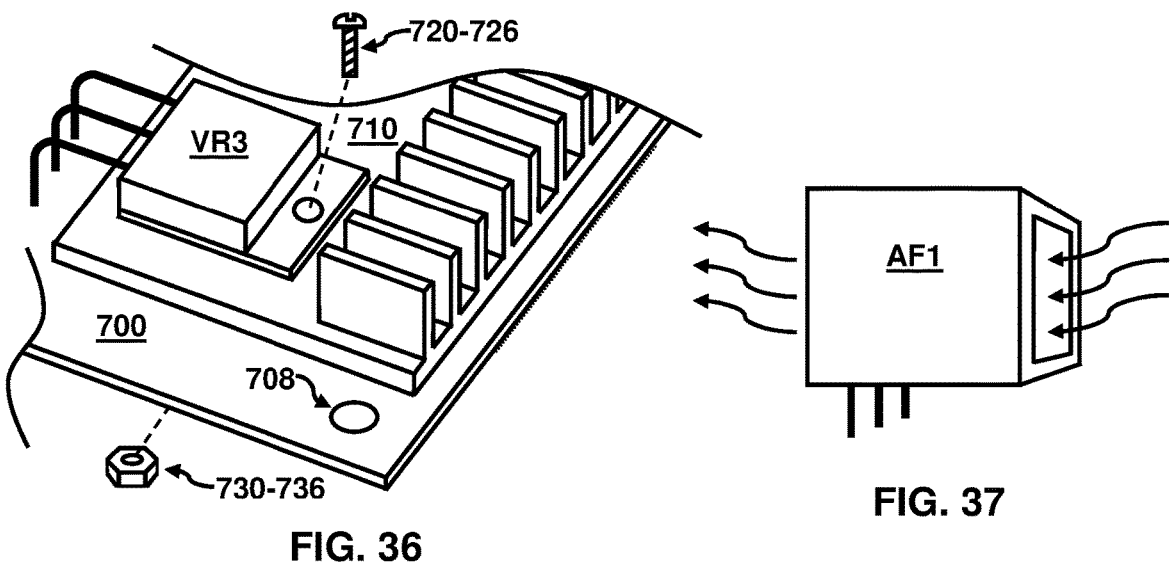
FIG. 36
FIG. 37

ION PLASMA DISINTEGRATOR

RELATED PATENT APPLICATION AND INCORPORATION BY REFERENCE

This utility application is a Continuation in Part or CIP of U.S. patent application Ser. No. 15/230,662 filed on Aug. 8, 2016. This related application or CIP is incorporated herein by reference and made a part of this application. If any conflict arises between the disclosure of the invention in this utility application and that in the related application, the disclosure in this utility application shall govern. Moreover, the inventor(s) incorporate herein by reference any and all patents, patent applications, and other documents hard copy or electronic, cited or referred to in this application as well as in the related application.

BACKGROUND OF THE INVENTION

(1) Field of the Invention

The invention generally relates to incinerator systems. More particularly, the invention relates to the use of ion plasma disintegrator systems to destroy documents and other objects.

(2) Description of the Related Art

There are many devices that shred documents or make use of an Ion Plasma arc none of which provide the benefits of the features and functions of this invention. This invention solves the problems inherent in prior art in multiple ways. There is no prior art that incorporates a method to direct the position of an Ion Plasma arc to insure complete vaporization of documents placed within an apparatus. There is no prior art that can operate as a compact stand-alone device suitable for an office environment. There is no prior art that incorporates multiple levels of safety devices to insure safe home or office operation. There is no prior art that incorporates phase synchronized electromagnetic coils of wire to control and or direct the position of an Ion Plasma arc.

For example U.S. Pat. No. 8,888,030 to Zhang et al. discloses a Paper Shredder using a shredding knife assembly to cut documents into small pieces. This and all paper shredders are inherently unsecure in that there are numerous documented cases where the shredded paper pieces have been reassembled compromising personal, corporate and government security. This invention overcomes the deficiencies with these devices by completely vaporizing documents placed in the apparatus.

Another example U.S. Pat. No. 6,057,524 to Kaatooka et al. discloses a Plasma Arc Utilizing Device making use of an Ion Plasma arc for cutting and welding. This application and other similar cutting or welding devices using an Ion Plasma arc are unsuitable for the destruction of documents and are not useable for this application.

Another example U.S. Pat. No. 6,444,944 to Schneider et al. discloses a Plasma Cutter with Integrated Air Compressor making use of an Ion Plasma arc for cutting and welding. The deficiencies in this design are the same as in Kaatooka.

Another example U.S. Pat. No. 3,708,675 to Frye et al. discloses a Plasma Arc Refuse Disintegrator. This apparatus could be used to destroy documents however it is a large industrial device incorporating water cooling for the electrodes and water cooled rams, requiring pumps and motors, refuse feeder motors, water spray nozzles creating a waste slurry and is unusable as a desktop apparatus in a home or office environment.

Another example U.S. Pat. No. 5,958,264 to Tsantrizos et al. discloses device for the Plasma Gasification and Vitrification of Ashes This apparatus is designed for the disposal of organics contained within ashes and not for documents. The process requires the injection of steam and produces a waste slag deposited into a crucible for disposal and is unusable as a desktop apparatus in a home or office environment.

Another example U.S. Pat. No. 9,121,605 to Carabin et al. discloses a Three Step Ultra-Compact Plasma System for the High Temperature Treatment of Waste Onboard Ships. This apparatus despite claiming to be Ultra Compact is in fact a large industrial device requiring water cooling having a motorized shredder and feed system and produces a waste slag deposited into a multiple crucibles with motors and gears and is unusable as a desktop apparatus in a home or office environment.

Another example U.S. Pat. No. 4,464,887 to Barton et al. discloses a Plasma Pyrolysis Waste Destruction device. This apparatus is a complex industrial device incorporating pumps, blowers, water injection, water cooling, alkaline injection, produces liquid waste material and is unusable as a desktop apparatus in a home or office environment.

Another example U.S. Pat. No. 7,101,518 to Ko et al. discloses a Plasma Disinfection System. This apparatus for supplying liquid for generating plasma to a reaction chamber to sterilize and disinfect an item wrapped in packaging material cannot be adapted for this application.

BRIEF SUMMARY OF THE INVENTION

The object of this invention is to provide a method to completely vaporize documents or photographs placed within the Ion Plasma Disintegrator (IPD) apparatus. This is accomplished by making use of an Ion Plasma electric arc. After plugging the IPD into a standard wall outlet the Power LED will turn on red indicating the apparatus is in standby mode and ready to receive documents.

An additional object of this invention is to destroy a document by rotating the two door handles on the glass door to the un-locked position, opening the door, inserting the document where it will rest within the borders of the upper and lower discharge plates. Close the glass door and rotate the two door handles into the locked position, this will close the two normally open safety switches behind the door. Press the Start button on the front of the apparatus, this will initiate the start sequence where the components on the main PC Board will first confirm all safety switches are closed and then close a relay starting the exhaust fan drawing air thru the airflow sensor checking the condition of the air filter. If the airflow is within tolerance a second relay will close turning on the High Voltage Transformer initiating the Ion Plasma arc between the discharge plates, at the same time the Power LED will turn from Red to Green, the Filter LED will light up Green, an internal 2 minute timer will start and the electromagnetic containment coils of wire will be activated starting the 4 cycles of the pre-programmed 30 second search pattern moving the Ion Plasma arc between the plates.

An additional object of this invention is providing a pre-programmed pattern which first draws the Ion Plasma arc across the front of the discharge plates and when it comes in contact with a document will ignite it and rapidly burn aided by the air flow drawn from the front to the rear of the plates at the same time the remaining ash will be rapidly vaporized by the Ion Plasma arc. The ash presents a shorter distance between the plates that will tend to keep the arc where remaining ash is overriding the push exerted by the electromagnetic containment coils of wire until the all of the ash is vaporized.

An additional object of this invention is to make use of the light produced by the Ion Plasma arc light the interior of the combustion chamber allowing the user to observe thru the front glass door if the plates are clear and if so have the option to press the Stop button, on the front of the apparatus, before the 2 minute timer has completed the pre-programmed cycle. When the 2 minute cycle ends or if a fault is detected or if the Stop button is pressed the relay supplying power to the high voltage transformer will open turning it Off at the same time a 30 second timer will start keeping the fan running to clear smoke thru the air filter and allow the plates to cool down before opening the relay supplying power the exhaust fan and turning off the Filter LED and turning the Power LED from Green to Red indicating the apparatus is ready to be opened for another document.

An additional object of this invention is the top and bottom discharge plates have undulating ribs running from the front of the plates to the rear of the plates to improve the air flow and initial burning of documents placed between the plates. The position of these ribs must be matched between the top and bottom plates in such a way as to maintain a uniform spacing between the plates. The height and number of these ribs can be varied to maximize the improved performance over the use of flat plates.

An additional object of this invention is the dimensions, scale, the functions and voltages used are not limited to the embodiment described herein.

BRIEF DESCRIPTION OF THE DRAWINGS

FIG. 8 shows a bottom view of the bottom exterior sheet metal after bending.

FIG. 9 shows a bottom view of the bottom exterior sheet metal prior to bending.

FIG. 10 shows a top perspective exploded view of the exhaust fan assembly

FIG. 11 shows a side perspective view of the air filter.

FIG. 12 shows a side perspective view of the air filter cover plate.

FIG. 26 shows a top internal perspective exploded view of the top and bottom exterior sheet metal and front PC board and safety switches.

FIG. 27 shows a top view of the front of the front PC board.

FIG. 28 shows a top view of the rear of the front PC board.

FIG. 29 shows side views of the front PC board, ground fault interrupter module and safety switches.

FIG. 34 shows a top view of the main pc board with mounting hardware.

FIG. 35 shows a partial view of the top exterior sheet metal vent holes with arrows indicating air flow.

FIG. 36 shows a partial perspective view of the main pc board, aluminum heat sink and one voltage regulator with mounting hardware.

FIG. 37 shows a perspective view of the solid state air flow sensor.

Figure 1:
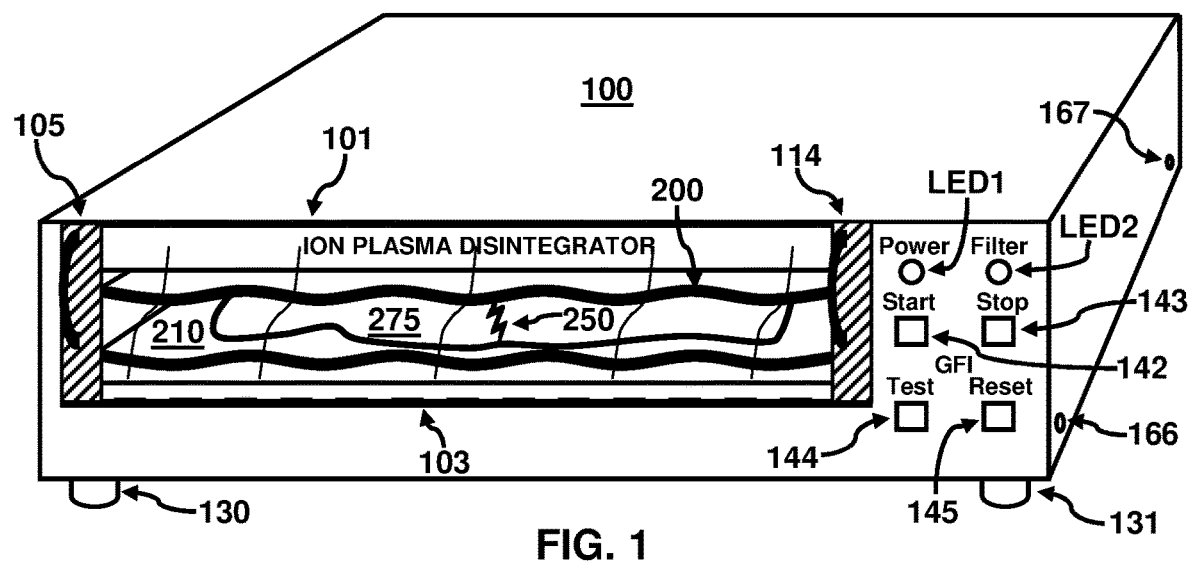
FIG. 1 shows a front perspective view of the exterior of the full assembly in operating mode.

REFERENCE NUMERALS IN THE DRAWINGS 100 top exterior sheet metal
101 glass door 102 bottom exterior sheet metal
103 piano hinge, for 101
104 bottom metal bracket, for 101
105 left door handle, for 101
106, 111, 115, 120 glass door handle washers, for 101
107 left metal bracket, for 101
108, 109 round voids, in 107
110, 119 round voids, in 101
112 left door lock, for 101
113, 122 door lock screws, for 101
114 right door handle, for 101
116 right metal bracket, for 101
117, 118 round voids, in 116
121 right door lock, for 101
125, 126 two key shaped voids, in 100
130-3 four rubber feet
135-8, 140-1, six round voids, in 100
142-5 four caps, for push button switches
146-9, 180-3 eight square voids, in 100
150-3 four screws for rubber feet
152 a rectangular void, in 100
155-8, 169, 184-7, 194-7, 431-4, 440-1, 453-4 twenty one round voids, in 102
160-3 four pie shaped voids, in 102
165-8, 230-3, 480-3 twelve short screws
170 air filter cover
171-2 air filter cover screws
173-6, 188-9, 190-3 ten short standoffs, press fit into 102
177-8, 179, 452 four rectangular voids, in 102
189-9 two round voids, in 170
200 top discharge plate
201-4 four undulations bent into 200
205-8 four screw threads, press fit into 200
209 top discharge plate ignition lead
210 bottom discharge plate
211-14 four undulations bent into 210
215-8 four screw threads, press fit into 200
219 bottom discharge plate ignition lead
222 spark gap
225, 226, 520, 620, 621 five crimp lugs
240-3 four long threaded standoffs
250 ion plasma arc
251 start point for ion plasma arc
252-9 eight reference points, indicating the position of the ion plasma arc over time
260-7 eight threaded high voltage insulators
270-3 four screws, for long threaded standoffs 240-3
275 paper document being disintegrated
300 air filter
301 charcoal filtering element, inside 300
302 fiberglass filtering element, inside 300
303 top combustion chamber sheet metal
304 bottom combustion chamber sheet metal
305 rectangular void, cut into 303
306-9, 330-2 seven round voids, in 304
310-29, 333-6, 393-6 twenty eight round voids, in 303
337-8 two short standoffs, press fit into 303
340-62 twenty three nuts, for metal clips holding electromagnetic coils
370-92 twenty three metal clips, for holding electromagnetic coils
400 top exhaust fan filter chamber sheet metal
401 side exhaust fan filter chamber sheet metal
402 rectangular void, cut into 400
410 rectangular void, cut into 401
405-6 two short standoffs, press fit into 400
407-8 two round voids, in 400
409 a notch, cut into 400
411 a notch, cut into 401
415-8 six round voids, in 401
421-2, 460-3 six long screws
423, 424, 465-8 six nuts
425, 426 two key shaped voids, in 102
435-8 four long standoffs, press fit into 102
446-9 four square voids, in 102
452 a rectangular void, cut into 102
463, 464 two screws, for mounting 400
470, 475 front door safety switch plungers
500 front pc board
504-11 eight round voids, in 500
522-5 four short screws, for GFI1
530-3 four threaded voids, in GFI1
600 laminated iron core, for TXMR1
601-4 four round voids, in TXMR1
605 current limiting air gap, in 600
630-3 four nuts, for mounting TXMR1
640-3 four long standoffs, for mounting TXMR1
650-3 four screws, for mounting TXMR1
700 main pc board
705 large round voids, in 700
706-9 four round voids, in 700
710 aluminum heat sink
720-6 seven screws, for mounting components to 710
730-6 seven nuts, for mounting components to 710
746-9 four nuts, for mounting 700
776-9 four standoffs, press fit into 102
AF1 a solid state air flow sensor
BD1 a bridge rectifier, containing D1-4
BD2 a bridge rectifier, containing D5-8
C1, C3, C5 three 500 uF capacitors
C2, C4 two 1000 uF capacitors
C6-9, C20, C21 six 1 uF capacitors
D1-4 four diodes
D5-8 four diodes
FAN1 an exhaust fan
FET1 a field effect transistor
FET2 a field effect transistor
FW1, FW2 two wires, connected to P36
GFI1 a ground fault interrupter module
GW1 a wire, connected to P24
GW2 a wire, connected to P38
GW3 a wire, connected to L3
HW2 a wire, connected to J2
HW3 a wire, connected to J3
HW4 a wire, connected to P2
HW5 a wire, connected to P3
IC1-4 four amplifiers, integrated circuits
IC5-8 four 8 bit digital to analog converters, integrated circuits
IC9 an 8 bit analog to digital converter, integrated circuit
IC10 a field programmable gate array, integrated circuit
IC11 an under-voltage detector, integrated circuit
IC12 an under-voltage detector, integrated circuit
IC13 an over-voltage detector, integrated circuit
IM1 a high voltage ignition module
IPD the Ion Plasma Disintegrator apparatus
J2 a single pin high voltage connector
J3 a single pin high voltage connector
J6, J8, J10, J11, J12, J14, J15, J31-4, J36 twelve 2 pin connectors
J16, J18 two 8 pin connectors
J24, J26, J28, J38 four 3 pin connectors
L1 the primary coil of wire, inside TXMR1
L2 a phase feedback coil of wire, inside TXMR1

L3 a secondary coil of wire, inside TXMR1
LED1 the Power Light Emitting Diode
LED2 the Filter Light Emitting Diode
LW2 a wire, connected to P38
LW3 an 8 conductor cable, connected to P16/P18
LW5, LW6 two wires, connected to P6
LW7, LW8 two wires, connected to P8
LW9, LW10 two wires, connected to P10
LW11, LW12 two wires, connected to P12
LW14, a wire, connected to P14
LW15 a wire, connected to P15
LW16 a wire, connected to P11
LW32 a 2 conductor cable, connected to P31/P32
LW33 a 2 conductor cable, connected to P33/P34
MC1-4 four electromagnetic containment coils of wire
NW2 a wire, connected to P38
P1 a 3 pin power connector
P2 a single pin high voltage connector
P3 a single pin high voltage connector
P6, P8, P10, P11, P12, P14, P15, P31-4, P36 twelve 2 pin connectors
P16, P18 two 8 pin connectors
P24, P26, P28, P38 four 3 pin connectors
PW1 a 3 conductor cable, connected to P1
PW2 a 3 conductor cable, connected to P26
R1-5, R9, R12, R15, R18 nine 10K resistors
R7, R8, R10, R11, R13, R14, R16, R17 eight 1K resistors
R20, R21 two 2.65K resistors
RLY1, RLY2 two power relays
S1 normally open power ON START switch
S2 normally open power OFF STOP switch
S5-6 two normally open safety switches
S3 normally open switch, contained within GFI1
S4 two pole circuit breaker switch, contained within GFI1
TS1 a normally closed thermally activated switch
VR1 a 5 Volt positive voltage regulator
VR2 a 24 Volt positive voltage regulator
VR3 a 24 Volt negative voltage regulator
TXMR1 the high voltage transformer assembly
TXMR2 the power transformer
XTL1 a 1 MHz oscillator crystal These and other aspects of the present invention will become apparent upon reading the following detailed description in conjunction with the associated drawings.

DETAILED DESCRIPTION OF EMBODIMENTS OF THE INVENTION

The following detailed description is directed to certain specific embodiments of the invention. However, the invention can be embodied in a multitude of different ways as defined and covered by the claims and their equivalents. In this description, reference is made to the drawings wherein like parts are designated with like numerals throughout.

Unless otherwise noted in this specification and the claims will have the meanings normally ascribed to these terms by those skilled in the art.

Unless the context clearly requires otherwise, throughout the description and the claims, the words "comprise", "comprising" and the like are to be construed in an inclusive sense as opposed to an exclusive sense; that is to say, in a sense of "including, but not limited to". Words using the singular or plural number also include the plural or singular number, respectively. Additionally, the words "herein", "above", "below", and words of similar import, when used in this application, shall refer to this application as a whole and not to any particular portion(s) of this application.

The detailed description of embodiments of the invention is not intended to be exhaustive or limit the invention to the precise form disclosed above. While specific embodiments of, and examples for, the invention are described herein for illustrative purposes, various equivalents modifications including but not limited to the size, scale, proportions or means to ignite and move the Ion Plasma arc, detect airflow and voltage and frequency of the high voltage transformer of the embodiment of the invention described herein are possible within the scope of the invention, as those skilled in the relevant art will recognize. For example, while steps are present in a given order, alternative embodiments may perform routines having steps in a different order. The teachings of the invention provided herein can be combined to provide further embodiments.

Aspects of the invention can be modified, if necessary, to employ the systems, functions and concepts of the various patents and application described above to provide yet further embodiments of the invention.

The present invention overcomes shortfalls in the prior art by providing the absolute destruction of documents or photographs placed within the Ion Plasma Disintegrator (IPD) apparatus. Paper shredders only cut documents into pieces and there are numerous documented cases of these shreds being reassembled compromising personal, corporate and government security. Additionally the ashes from burnt documents have also been reconstructed. Ion Plasma is defined as the fourth state of matter, the others being solid, liquid and gas, where some or all of the electrons have been stripped from their parent atoms. Ion Plasma arcs have been safely used to both cut and weld metal components. The high temperature generated by Ion Plasma is ideal for this application in that after ignition the arc will vaporize the remaining ash on an atomic level leaving only a black smudge between the plates. The embodiment described herein is for a desktop version operating from a standard wall outlet, this IPD apparatus can be scaled up for industrial applications.

The present invention incorporates numerous devices and methods to ensure safe operation. The following detailed description of the drawings and their functions will clearly illustrate how this unique IPD apparatus can benefit those who require absolute security when destroying sensitive documents.

FIG. 1 is a front perspective exterior view of one embodiment of the full assembly of the invention in operating mode where the top exterior sheet metal 100 is shown after bending to form the front and sides, the glass door 101 is closed and attached with the piano hinge 103 spot welded to the top exterior sheet metal 100, the left door handle 105 is in the locked position, the right door handle 114 is in the locked position. The Power Light Emitting Diode LED1 is for showing standby and power ON/OFF and fault states, the Filter Light Emitting Diode LED2 is for showing the status of the filter and fault states as detailed in FIG. 38. Two of the four rubber feet 130 and 131, the cap 142 for the Start push button switch, the cap 143 for the Stop push button switch, the cap 144 for the ground fault interrupter module GFI1 Test push button switch, the cap 145 for the ground fault interrupter module GFI1 Reset push button switch, two short screws 166 and 167 for securing the top exterior sheet metal 100 to the bottom exterior sheet metal 102 are shown. The top discharge plate 200, the bottom discharge plate 210, with a representation the Ion Plasma arc 250, is shown with a representation of the process of a paper document being disintegrated 275. A detailed description of the functions of the sub-assemblies will follow.

Figure 2:
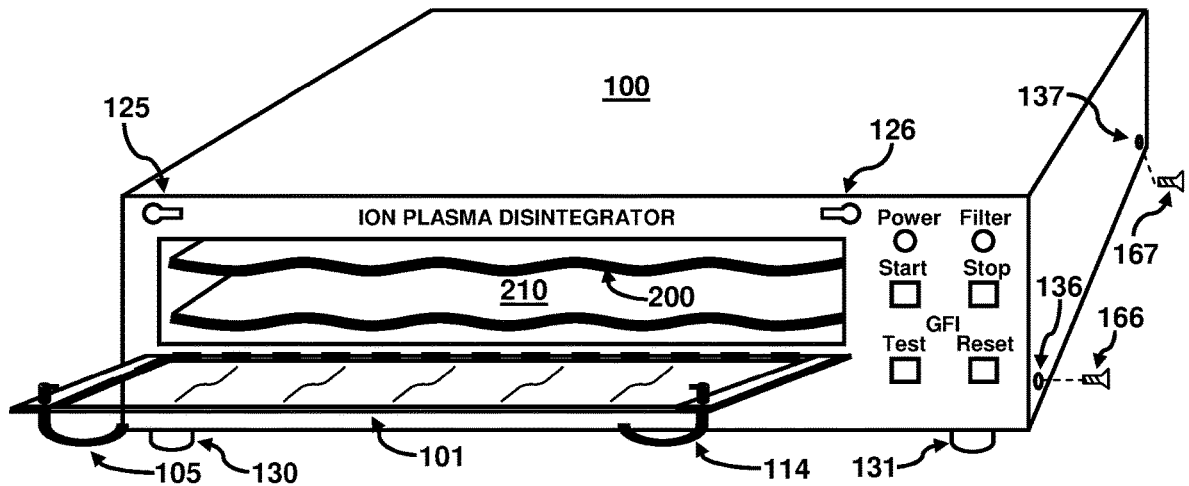
FIG. 2 shows a front perspective view of the exterior of the full assembly with the glass front assess door open.
Figure 5:
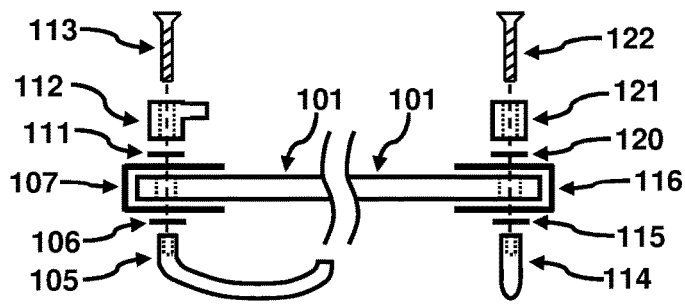
FIG. 5 shows a top exploded view of the glass door assembly.

FIG. 2 is a front perspective exterior view of one embodiment of the full assembly with the glass door open ready to receive documents where the top exterior sheet metal 100 is shown after bending to form the front and sides, the glass door 101 is opened, the left door handle 105 is in the un-locked position, the right door handle 114 is in the un-locked position, the two key shaped voids 125 and 126 the top exterior sheet metal 100 are for the door locks 112 and 122 detailed in FIG. 5. Two of the four rubber feet 130 and 131 and two round voids 136 and 137 with two short screws 166 and 167 for securing top exterior sheet metal 100 to the bottom exterior sheet metal 102 are shown.

Figure 3:
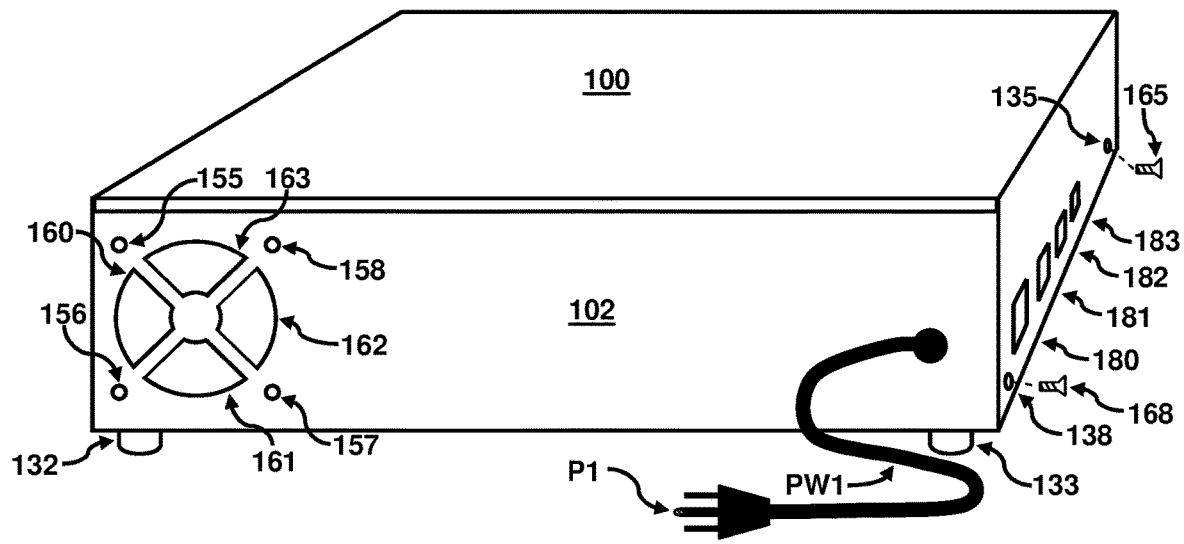
FIG. 3 shows a rear perspective view of the exterior of the full assembly.

FIG. 3 is a rear perspective exterior view of one embodiment the invention where the top exterior sheet metal 100 shown after bending, the bottom exterior sheet metal 102 is shown after bending and the 3 pin power connector P1 with 3 conductor cable PW1 supply power to the assembly. Two of the four rubber feet 132 and 133 and two round voids 135 and 138 with two short screws 165 and 168 for securing top exterior sheet metal 100 to the bottom exterior sheet metal 102 are shown. Four round voids 155-8 and four pie shaped voids 160-3 cut into the bottom exterior sheet metal 102 are for the exhaust fan FAN1 detailed in FIG. 10. Four square voids 180-3 in the top exterior sheet metal 100 are for the intake of air.

Figure 4:
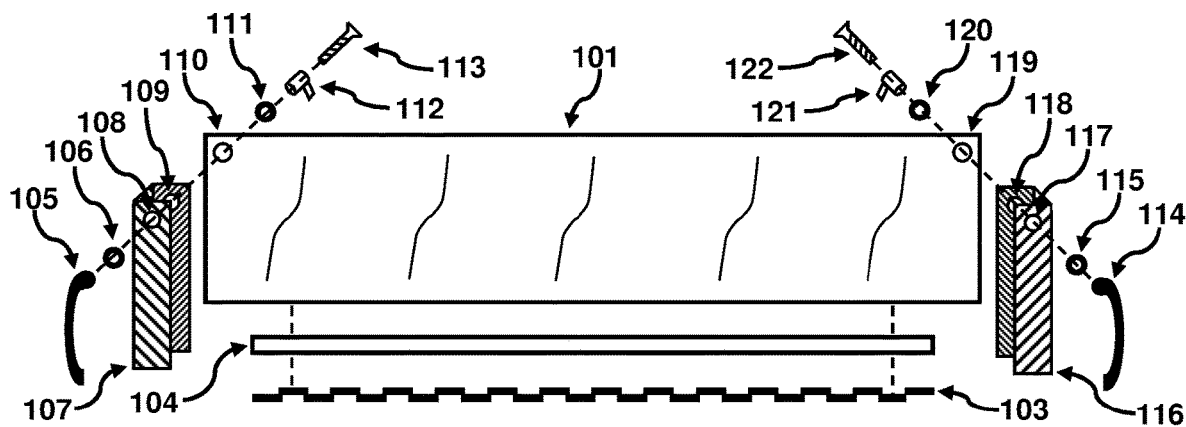
FIG. 4 shows a front exploded view of the glass door assembly.

FIG. 4 is a front exploded view of the glass front access door of one embodiment of the invention where the glass door 101 is assembled with the piano hinge 103 spot welded to the bottom metal bracket 104 press fit onto the glass door 101. The left door handle 105 is in the locked position with glass door handle washers 106 and 111 allowing the door handle to freely rotate around the left metal bracket 107 thru the round voids 108 and 109 in the left metal bracket 107 press fit onto the glass door 101 and secured thru the round void 110 in the glass door 101 to the left door lock 112 with door lock screw 113. The right door handle 114 is in the locked position with glass door handle washers 115 and 120 allowing the door handle to freely rotate around the right metal bracket 116 thru the round voids 117 and 118 in the right metal bracket 116 press fit onto the glass door 101 and secured thru the round void 119 in the glass door 101 to the right door lock 121 with door lock screw 122.

FIG. 5 is a top exploded view of the glass front access door of one embodiment of the invention where the glass door 101 is shown with the left door handle 105 is in the un-locked position with glass door handle washers 106 and 111 allowing the door handle to freely rotate around the left metal bracket 107 press fit onto the glass door 101 and secured to the left door lock 112 with door lock screw 113. The right door handle 114 is in the locked position with glass door handle washers 115 and 120 allowing the door handle to freely rotate around the right metal bracket 116 press fit onto the glass door 101 and secured to the right door lock 121 with door lock screw 122.

Figure 6:
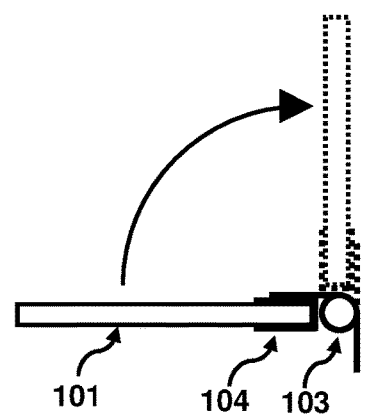
FIG. 6 shows a side view of the glass door assembly and piano hinge.

FIG. 6 is a side view of the glass front access door of one embodiment of the invention where the glass door 101 is shown in in solid lines in the open position and in dashed lines in the closed position where the piano hinge 103 is spot welded to the bottom metal bracket 104 press fit onto the glass door 101.

Figure 7:
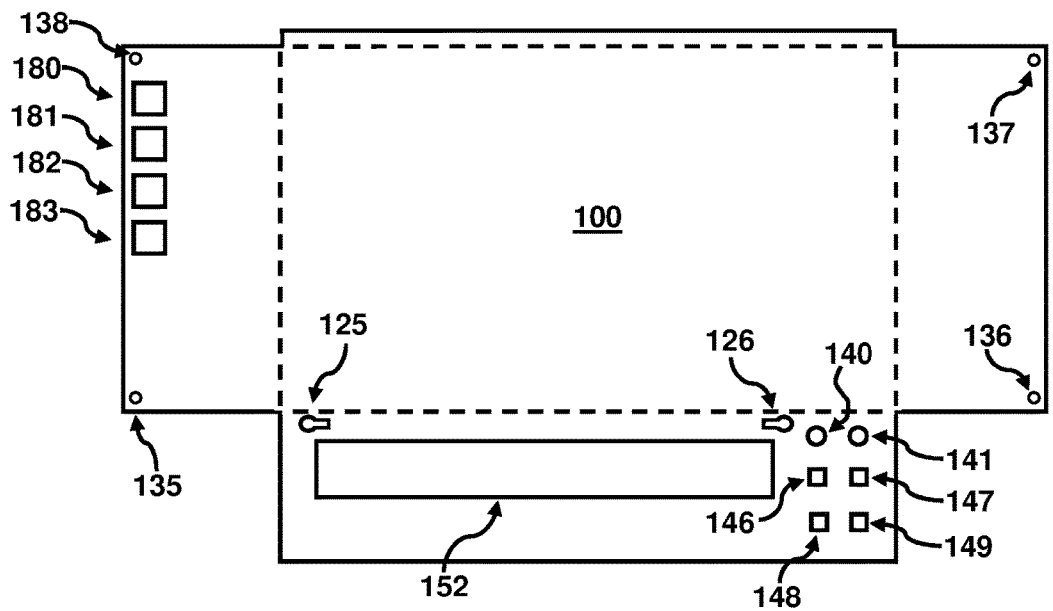
FIG. 7 shows a top view of the top exterior sheet metal prior to bending.

FIG. 7 is a top view of one embodiment the invention where top exterior sheet metal 100 is shown before bending along the dashed lines, the front and right sides overlap the same sides of the bottom exterior sheet metal 102 creating a double wall to reinforce the locks and hide mounting hardware, the short fold on the back forms a lip at the rear as shown in FIG. 3 the folded section on the left side is secured with a short fold on the bottom exterior sheet metal 102 as shown in FIG. 9. The two key shaped voids 125 and 126 in the top exterior sheet metal 100 are for the door locks 112 and 122, four round voids 135-8 are for securing the top exterior sheet metal 100 to the bottom exterior sheet metal 102, rectangular void 152 is the opening covered by the glass door 101, two round voids 140 and 141 are openings for the Power and Filter Light Emitting Diodes LED1 and LED2, four square voids 146-9 are for the push button switches S1-4 and four square voids 180-3 are for the intake of air.

Figure 17:
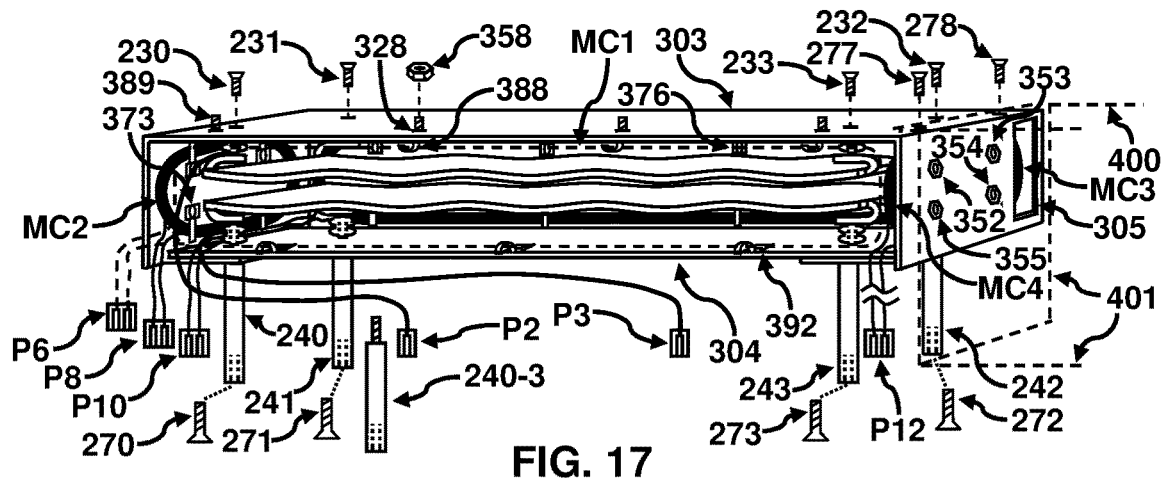
FIG. 17 shows a front perspective view of the combustion chamber.
Figure 21:
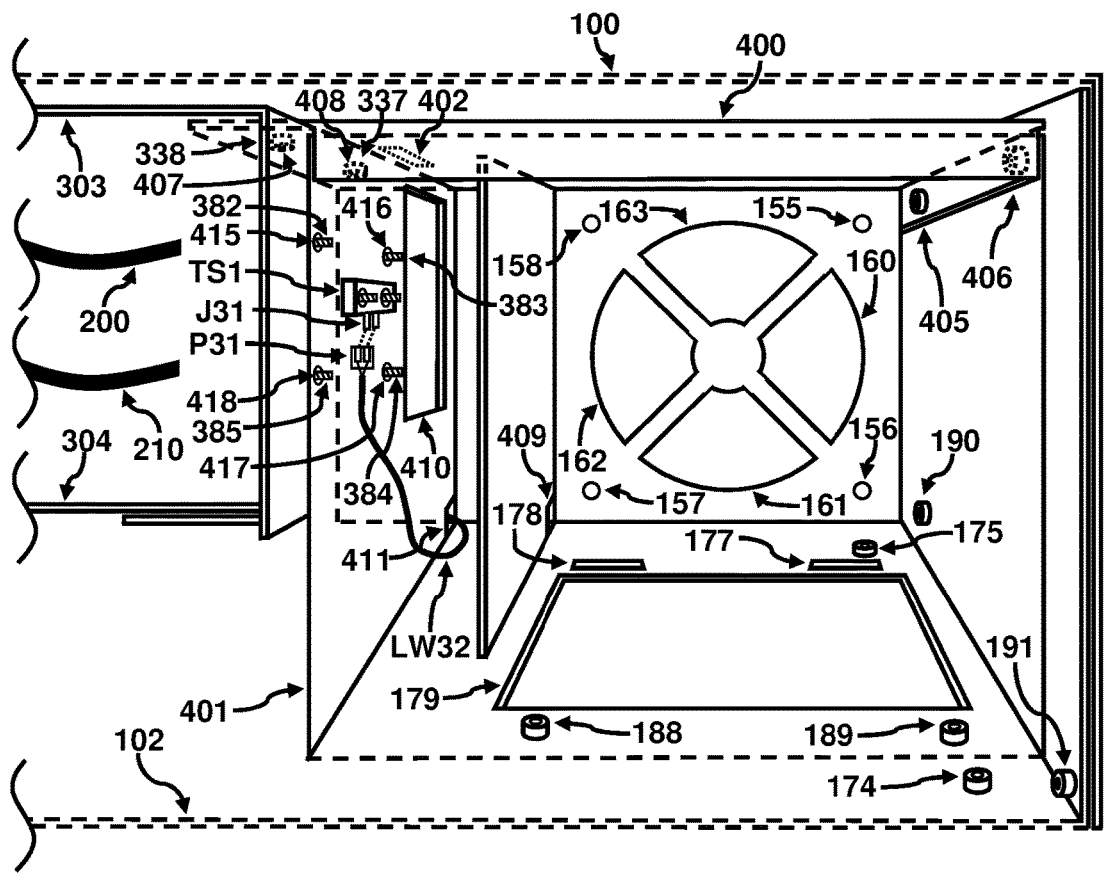
FIG. 21 shows a front perspective view of the exhaust fan filter chamber.
Figures 31, 32:
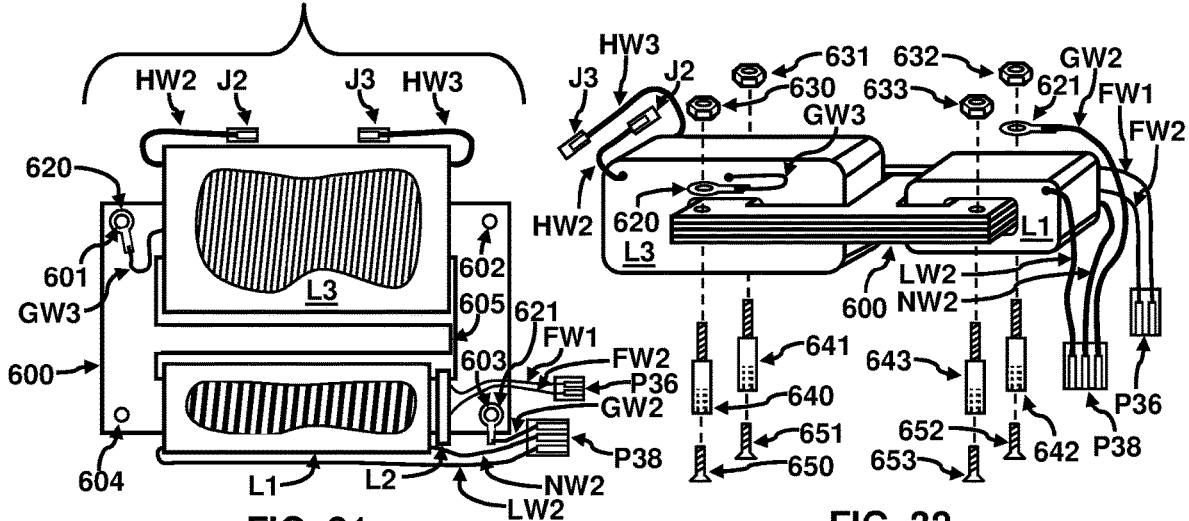
FIG. 31 shows a top cut away view of the high voltage transformer assembly.
FIG. 32 shows a side perspective view of the high voltage transformer assembly with mounting hardware.

FIG. 8 is a bottom view of one embodiment the invention where the bottom exterior sheet metal 102 shown after bending with the four rubber feet 130-3 mounted with four screws 150-3 secured to four threaded standoffs 173-6 press fit into the other side of the bottom exterior sheet metal 102 as shown in FIG. 21. The four threaded standoffs 776-9 press fit into the other side of the bottom exterior sheet metal 102 are for mounting the main pc board 700 as shown FIG. 34. The air filter cover 170 is secured with the two screws 171 and 172 and two rectangular voids 177 and 178 cut in the bottom exterior sheet metal 102. The four screws 270-3 are for mounting the top combustion chamber sheet metal 303 and bottom combustion chamber sheet metal 304 as shown in FIG. 17. The four screws 650-3 are for mounting the high voltage transformer assembly TXMR1 as shown in FIG. 32.

FIG. 9 is a bottom view of view of one embodiment the invention where the bottom exterior sheet metal 102 is shown before bending along the dotted lines, the top and left sides overlap inside the same sides of the top exterior sheet metal 100 creating a double wall to reinforce the locks and hide mounting hardware. The four rubber feet 130-3, are mounted with four screws 150-3 and secured with four threaded standoffs 173, 174, 175, and 176 press fit into the other side of the bottom exterior sheet metal 102. The four threaded standoffs 776-9 are press fit into the other side of bottom exterior sheet metal 102 for mounting the main pc board 700 as shown in FIG. 34. The two round voids 188 and 189 and two rectangular voids 177 and 178 cut in the bottom exterior sheet metal 102 are for securing the air filter cover 170. The round void 169 is for the 3 conductor cable PW1, rectangular void 179 cut into the bottom exterior sheet metal 102 is for receiving the air filter 300 shown installed in place with the air filter cover 170 removed. The four round voids 184-7 are for mounting the top combustion chamber sheet metal 303 and the bottom combustion chamber sheet metal 304 with four long threaded standoffs 240-3 as shown in FIG. 17. The four round voids 194-7 are for mounting the high voltage transformer assembly TXMR1 with four long standoffs 640-3 as shown in FIG. 32. The four threaded standoffs 190, 191, 192 and 193 press fit into the bottom exterior sheet metal 102 are for securing the top exterior sheet metal 100 as shown in FIG. 21. The four round voids 155-8 are for mounting the exhaust fan FAN1 and the four pie shaped voids 160-3 cut into the bottom exterior sheet metal 102 are the air vents for the exhaust fan FAN1. The two key shaped voids 425 and 426 cut into the bottom exterior sheet metal 102 are for the door locks 112 and 122 detailed in FIG. 5. The four round voids 431-4 are for mounting the normally open safety switches S5 and S6 and the four long standoffs 435-8 are press fit into the bottom exterior sheet metal 102 for mounting the front pc board 500 as shown in FIG. 26, two round voids 440 and 441 are openings for the Power and Filter Light Emitting Diodes LED1 and LED2, four square voids 446-9 are for the push button switches, rectangular void 452 is the opening covered by the glass door 101, rectangular hole 179 is for access to insert and remove the air filter 300, two round voids 453 and 454 with two screws 463 and 464 are for mounting the top exhaust fan filter chamber sheet metal 400 shown in FIG. 21.

FIG. 10 is a top exploded perspective view of one embodiment of the invention where, the exhaust fan FAN1 four mounting screws 480-3 and nuts 484-7 are shown along with 2 pin connector P33 which plugs into 2 pin connector J33 with 2 conductor cable LW33 connected to 2 pin connector P34.

FIG. 11 is a side perspective view of one embodiment of the invention where the air filter 300 comprising a charcoal filtering element 301 to remove the odor created by the disintegration process and a fiber glass filtering element 302 to remove smoke particles created by the disintegration process.

FIG. 12 is a side perspective view of one embodiment of the invention where the air filter cover 170 with two round voids 198 and 199 and the two screws 171 and 172 for securing this cover are shown.

Figure 13:
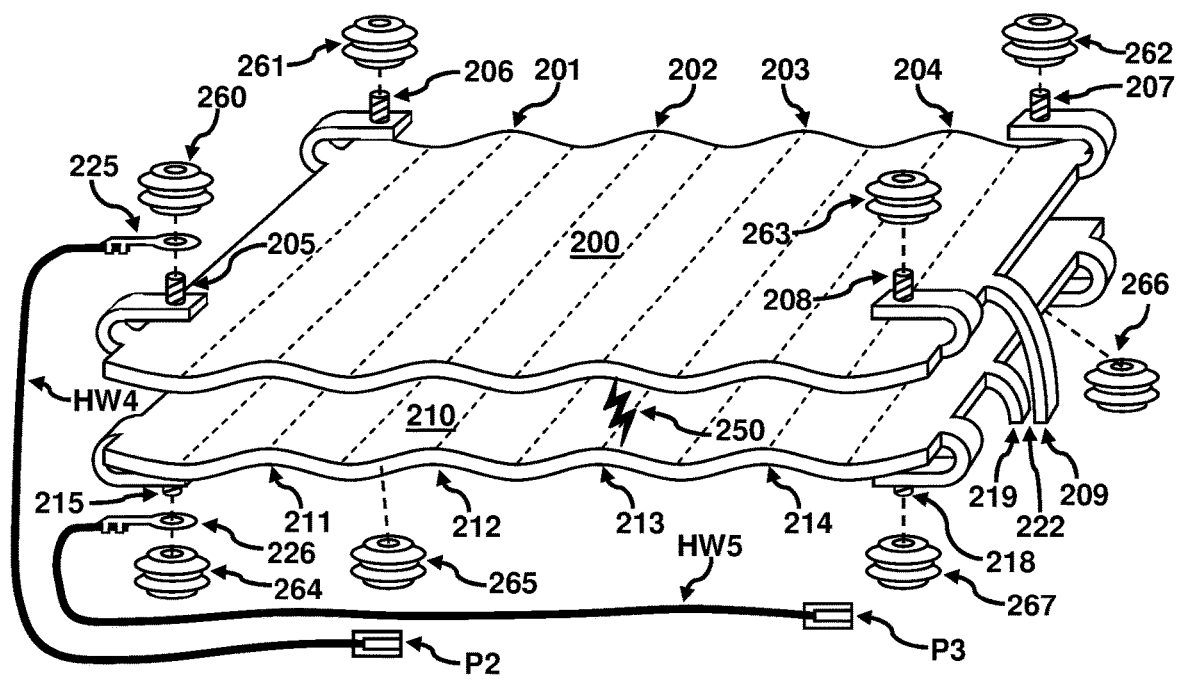
FIG. 13 shows a side exploded perspective view of the undulated discharge plates after bending.
Figure 14:
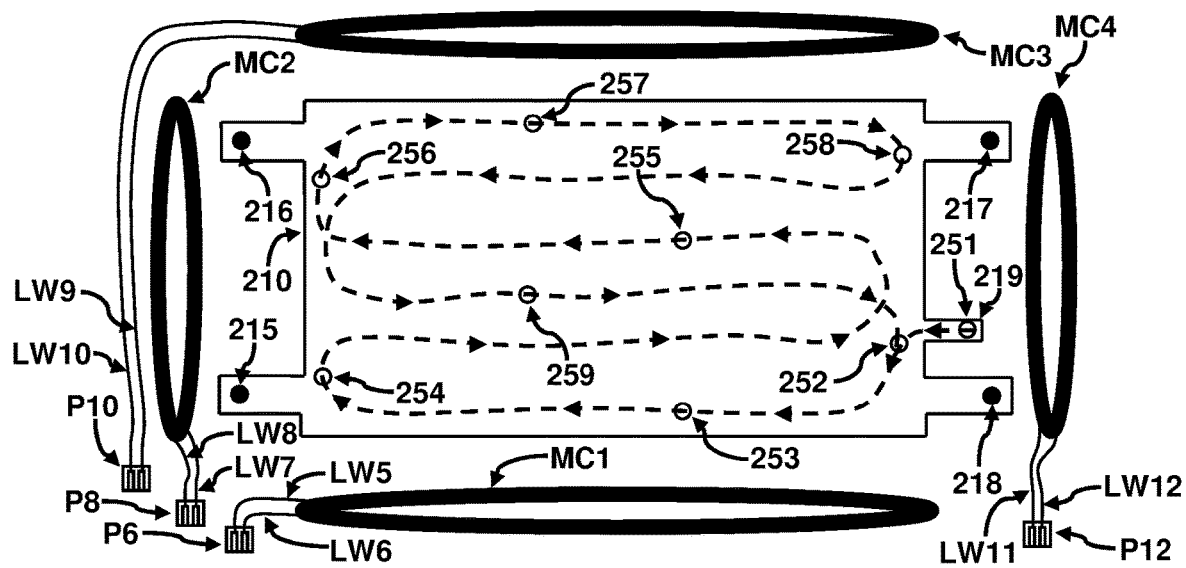
FIG. 14 shows a top view of the bottom discharge plate prior to bending and magnetic containment coils of wire.
Figure 38:
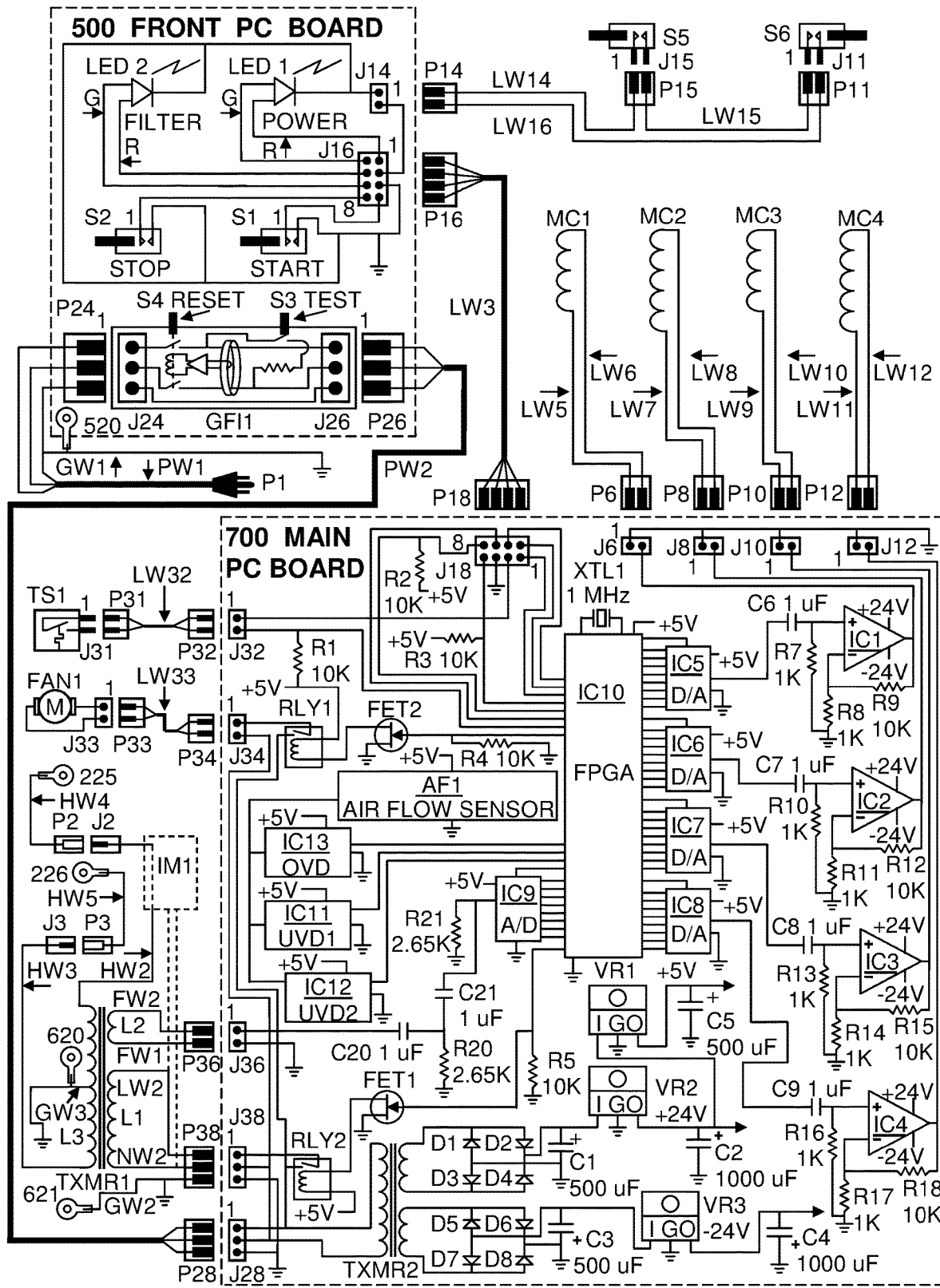
FIG. 38 shows the schematic for the internal electronic components.

FIG. 13 is a top side perspective view of one embodiment of the invention where the top and bottom discharge plates 200 with undulations 201-4 and 210 with undulations 211-14 shown after bending, six of the eight screw threads 205-8, 215, and 218 press fit into these plates are shown, all eight of the threaded high voltage insulators 260-7 are shown in this view, single pin high voltage connector P2, wire HW4 and crimp lug 225 are connected to the top discharge plate 200 by screwing high voltage insulator 269 onto screw thread 205, single pin high voltage connector P3, wire HW5 and crimp lug 226 are connected to the bottom discharge plate 210 by screwing high voltage insulator 264 onto screw thread 215. The undulating ribs 201-4, 211-4 running from the front of the plates to the rear of the plates to improve the air flow and initial burning of documents placed between the plates. The position of these ribs must be matched between the top and bottom plates in such a way as to maintain a uniform spacing between the plates in order to maintain a uniform temperature of the ion plasma arc 250. Further the field generated by the electromagnetic coils of wire must be sufficient to overcome the tendency of the ion plasma arc 250 to migrate to high points between the plates and to keep the arc moving across the plates. The height and number of these ribs can be varied to maximize the improved performance over the use of flat plates. The top discharge plate ignition lead 209 and bottom discharge plate ignition lead 219 come close together at their ends forming a spark gap 222. When the high voltage transformer assembly TXMR1 is turned ON a spark will jump across the spark gap 222, this is the start point for the ion plasma arc 251 as shown in FIG. 14 forming the Ion Plasma arc 250 the heat from this arc creates an electric flame that will rise between the leads, the Jacobs Ladder effect, and rotate between the plates where it will be moved by the phase synchronized electromagnetic containment coils. An alternate ignition method is to place a high voltage ignition module IM1 as shown in FIG. 38 as a dotted outline where it will generate a periodic low current high voltage electrical pulse sufficient to create an electric spark between the discharge plates igniting the high current Ion Plasma arc 250. This will eliminate the need for the spark gap 222 and ignition leads 209 and 219. This will also allow for a lower voltage and higher current output in the high voltage transformer assembly TXMR1 creating a hotter and more efficient Ion Plasma arc. To clarify why this or other ignition methods are necessary to maximize the high temperature required to vaporize the carbon remaining after burning of paper documents an understanding of the difference between an electric spark and an Ion Plasma arc is herein described;

A rule of thumb for the voltage required to form an electric spark that will break down the resistance of air is about 25,000 volts per inch or about 10,000 volts per centimeter dependent upon altitude, temperature and humidity, in the current embodiment the space between the discharge plates 200 and 210 is about 1.5 inches or about 3.8 centimeters requiring a minimum of 37,500 volts to initiate a spark between the plates. The current required to change an electric spark into an Ion Plasma arc is about 0.03 amps at 10,000 volts the higher the current the hotter the Ion Plasma arc. An Ion Plasma arc literally burns the surrounding air lowering its resistance allowing the arc to bridge a greater distance as long as power is sustained. The current embodiment incorporates a high voltage transformer assembly TXMR1 with a 10,000 volt output connected to a standard 110 volt wall outlet with a maximum current of 15 amps available. Using the basic formula A×V=W where:

A=Amps V=Volts W=Watts $$A \times V = W$$

$$15 \times 110 = 1,650 \text{ Watts}$$

Therefore the current between the plates can be calculated as:

$$A \times 10,000 = 1,650$$

$$1,650/10,000 = A$$

A=0.165 Amps

This current will create a sufficient amount of heat to quickly vaporize any remaining ash. The spark gap 222 should be about 0.20 inches or about 0.5 centimeters to insure self-ignition at 10,000 volts. If the voltage of the high voltage transformer assembly TXMR1 was raised to bridge the gap between the discharge plates the available current would be much lower and less effective.

FIG. 14 is a top view of one embodiment of the invention where the bottom discharge plate 210 shown before bending, four screw threads 215-8 press fit into these plates and the relative positions of the four electromagnetic containment coils of wire MC1-4 wound with high temperature insulation and eight lead wirers LW5-12 and four 2 pin connectors P6, P8, P10 and P12 with wirers LW5, LW6, LW7, LW8, LW9, LW10, LW11 and LW12 are shown. The dashed lines show the relative position and arrows indicate the direction of travel of the Ion Plasma arc 250 as its magnetic field is repelled by interaction of the magnetic fields generated by the four electromagnetic containment coils of wire MC1-4. The length of the wire comprising these coils are all the same providing an equal load on the amplifiers IC1-4 shown in FIG. 38 however there are more turns in smaller diameter MC2 and MC4 providing a higher field strength to compensate for the extra distance between these coils. After ignition at the start point for the ion plasma arc 251 a pre-programmed pattern of varying amplitudes applied to the electromagnetic containment coils of wire MC1-4 as shown in FIGS. 39-42 will move the Ion Plasma arc 250 along the dotted line to search for any document or remaining ash between the plates, the eight indicated reference points 252-9 will repeat every 30 seconds. The force applied by the magnetic fields are relatively weak and when the Ion Plasma arc 250 comes in contact with any document or remaining ash between the plates it will stop moving until there is nothing left to disintegrate. To create a repelling force the magnetic fields generated by the electromagnetic containment coils of wire MC1-4 are powered by 60 Hz sine waves that are 90 degrees out of phase, as described in FIG. 38, with the magnetic field generated by the Ion Plasma arc 250 which is at right angles to the electromagnetic containment coils of wire MC1-4 and as shown in FIGS. 39-42. This 90 degree phase shift may be modified to optimize performance. There is always some power applied to all of the electromagnetic containment coils of wire to contain the Ion Plasma arc 250 within the margins of the plates. Additionally the magnetic field in MC3 maintains a higher baseline field amplitude as shown in FIG. 41 to compensate for the airflow produced by the exhaust fan FAN1 that is directed from the front to rear of the plates and will tend to push the Ion Plasma arc 250 across the plates. This air flow also keeps clean air in contact with the glass door 101 to prevent darkening and pulls all smoke thru air filter 300.

Figure 15:
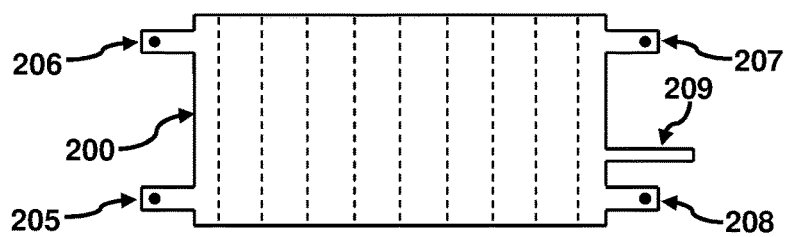
FIG. 15 shows a top view of the top discharge plate prior to bending.

FIG. 15 is a top view of one embodiment of the invention showing the top discharge plate 200, shown before bending, with the top discharge plate ignition lead 209 and four screw threads 205-8 press fit into this plate.

Figure 16:
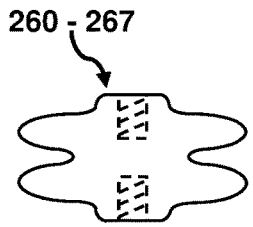
FIG. 16 shows a side view of one of the high voltage insulators.

FIG. 16 is a side view of one embodiment of the invention showing a detail of one of the eight threaded high voltage insulators 260-7, the dashed lines represent threaded voids for the mounting hardware.

FIG. 17 is a front perspective view of one embodiment of the invention showing the combustion chamber where the top combustion chamber sheet metal 303 shown after folding is secured to the bottom combustion chamber sheet metal 304 with four long threaded standoffs 240-3 screwed into four high voltage insulators 264-7 securing the bottom discharge plate 210 as shown in FIG. 13 and attached to the bottom exterior sheet metal 102 with four screws 270-3. The top combustion chamber sheet metal 303 with four short screws 230-3 screwed into four high voltage insulators 260-3 secures the top discharge plate 200 as shown in FIG. 13. The two short screws 277 and 278 are screwed into two short standoffs 337 and 338 press fit into the top combustion chamber sheet metal 303 securing the top exhaust fan filter chamber sheet metal 400 shown as a dashed outline in this view and detailed in FIG. 21. Twenty three metal clips 370-92 secure the four electromagnetic containment coils of wire MC1-4 shown with four 2 pin connectors P6, P8, P10 and P12, as detailed in FIG. 14, and are secured with twenty three nuts 340-62. Electromagnetic containment coil of wire MC1 is shown as a dashed outline in this view. All metal clips and nuts are not shown in this view. Additionally four of nuts for metal clips 352-5 also secure the side exhaust fan filter chamber sheet metal 401 shown as a dashed outline in this view and detailed in FIG. 21. Single pin high voltage connectors P2 and P3 are connected to discharge plates 200 and 210 as detailed in FIG. 13. The rectangular void 305 cut into the top combustion chamber sheet metal 303 is the exhaust vent for the heat and smoke produced in the disintegration process. The front of the top combustion chamber sheet metal 303 seals against the folded up front of the bottom exterior sheet metal 102, the recess formed by the shorter bottom combustion chamber sheet metal 304 creates the air intake slot flowing from below and from the front to the back of the top and bottom discharge plates 200 and 210.

Figure 18:
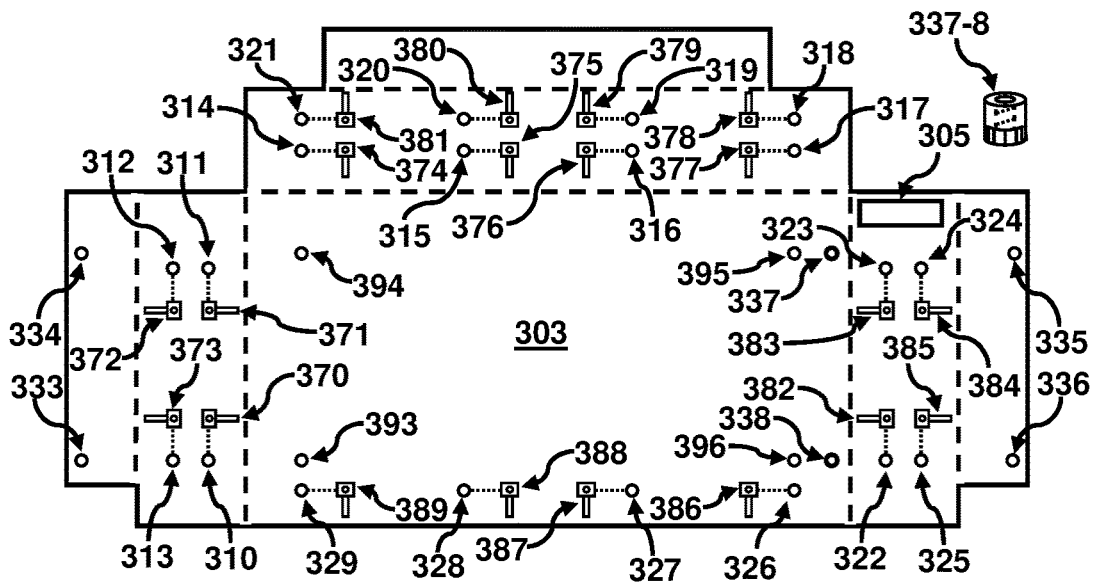
FIG. 18 shows a bottom view of the top combustion chamber sheet metal prior to bending.

FIG. 18 is a top view of one embodiment of the invention showing the top combustion chamber sheet metal 303, before folding along the dashed lines, where twenty eight round voids 310-29, 333-6, 393-6, two short standoffs 337-8 are press fit into the top combustion chamber sheet metal 303, twenty metal clips 370-89 for holding electromagnetic coils of wire MC1-4 and rectangular void 305 for venting hot exhaust gas are shown.

Figure 19:
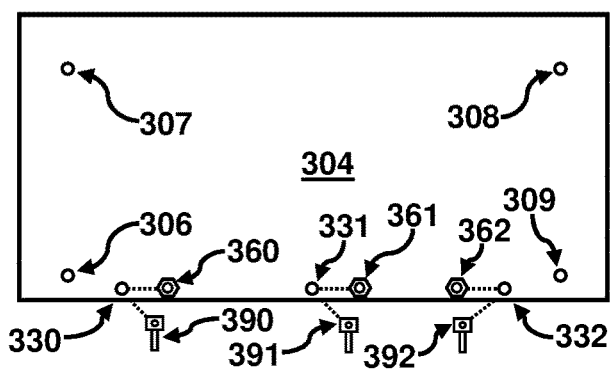
FIG. 19 shows a bottom view of the bottom combustion chamber sheet metal.

FIG. 19 where a top view of one embodiment of the invention showing the bottom combustion chamber sheet metal 304 where seven round voids 306-9, 330-2, three metal clips 390-2 and three nuts 360-2 for holding electromagnetic coil of wire MC1 are shown.

Figure 20:
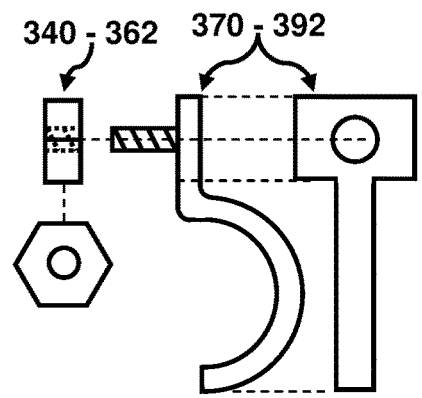
FIG. 20 shows a front and side view of the electromagnetic containment coils mounting hardware.

FIG. 20 where a top and side views of one embodiment of the invention showing a detail of the twenty three metal clips 370-92 and twenty three nuts 340-62 for holding the electromagnetic containment coils of wire MC1-4 are shown.

Figure 23:
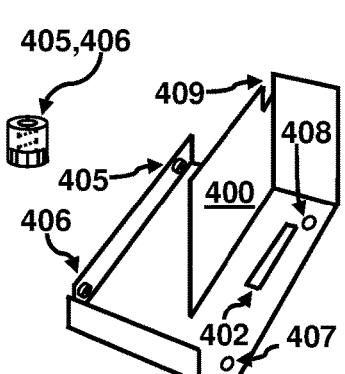
FIG. 23 shows a bottom perspective view of the top exhaust fan filter chamber sheet metal after bending.
Figure 30:
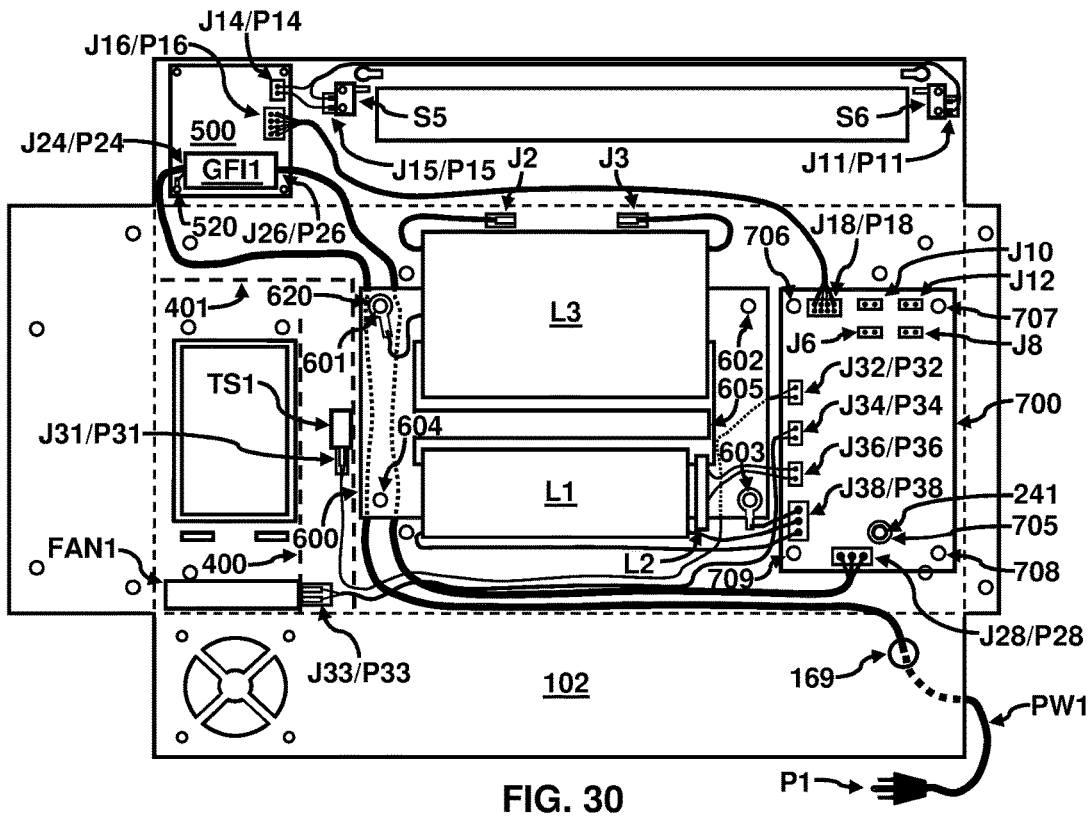
FIG. 30 shows a top view of the bottom exterior sheet metal prior to bending with the front pc board, high voltage transformer assembly, exhaust fan and main pc board.

FIG. 21 is a front perspective view of one embodiment of the invention showing the exhaust fan filter chamber where a partial view of the top exterior sheet metal 100 having dashed lines where the folded section of the front is not shown in this view and the solid lines show the right side of the folded sheet metal. A partial view of the bottom exterior sheet metal 102 having dashed lines where the folded section of the front is not shown in this view and the solid lines show the right side of the folded sheet metal with four round voids 155-8 for mounting FAN1, four pie shaped voids 160-3 for venting FAN1, two rectangular voids 177-8 for securing the air filter cover 170, a rectangular void 179 for inserting and removing the air filter 300 and six short standoffs press fit into the bottom exterior sheet metal 102, two short standoffs 174 and 175 for securing two of the four rubber feet 131-2, two short standoffs 188 and 189 for securing the air filter cover 170 and two short standoffs 190 and 191 for securing the top exterior sheet metal 100 to the bottom exterior sheet metal 102. A partial view of the top and bottom discharge plates 200 and 210 and the bottom combustion chamber sheet metal 304 are shown as a visual reference. The partial view of top combustion chamber sheet metal 303 having two press fit short standoffs 337 and 338 shown in dotted lines for securing the top exhaust fan filter chamber sheet metal 400 with two screws 277-8 as shown in FIG. 17, and the screws for four of the metal clips for holding electromagnetic coils 382-5 also secure the side exhaust fan filter chamber sheet metal 401 with four nuts 352-5 as shown in FIG. 17. When folded as shown in FIG. 23 the top exhaust fan filter chamber sheet metal 400 forms a baffle to direct the hot exhaust gas emerging from a rectangular void 410 to the front of the air filter 300 shown in FIG. 9, the rectangular void 402, shown in dotted lines, draws cool air across the top of the combustion chamber to keep the top exterior sheet metal 100 cool and to mix with the hot exhaust gas protecting the air filter 300. The two short standoffs 405 shown in solid lines and 406 shown in dotted lines press fit into the top exhaust fan filter chamber sheet metal 400 are secured to the bottom exterior sheet metal 102 with two screws 463 and 464 shown in FIG. 9. The notch 409 cut into the top exhaust fan filter chamber sheet metal 400 is for the 2 conductor cable LW33. The normally closed thermally activated switch TS1 with 2 pin connector J31, protect the combustion chamber from overheating, 2 pin connector P31 and 2 conductor cables LW32 and LW33 as shown in FIG. 30, are routed thru the notch 411 cut into the side exhaust fan filter chamber sheet metal 401. The folded front of the side exhaust fan filter chamber sheet metal 401 is shown with dashed lines at the top and bottom and a solid line on the right side.

Figure 22:
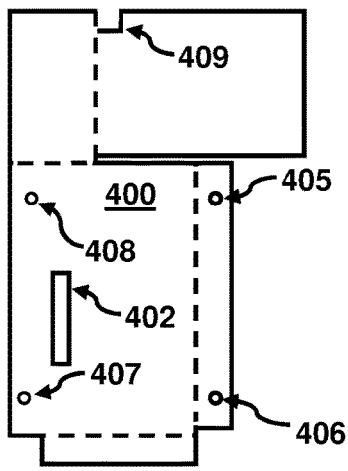
FIG. 22 shows a top view of the top exhaust fan filter chamber sheet metal prior to bending.

FIG. 22 is a top view of one embodiment of the invention showing the top exhaust fan filter chamber sheet metal 400, before bending along the dashed lines, with two round voids 407 and 408, two press fit standoffs 405 and 406, a rectangular void 402 and a notch 409 cut into the sheet metal.

FIG. 23 is a bottom perspective view of one embodiment of the invention showing the top exhaust fan filter chamber sheet metal 400, after bending, with two round voids 407 and 408, two press fit standoffs 405 and 406, a rectangular void 402 and a notch 409 cut into the sheet metal.

Figure 24:
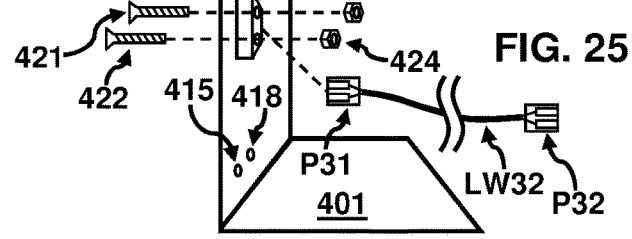
FIG. 24 shows a top perspective view of the side exhaust fan filter chamber sheet metal after bending.

FIG. 24 is a top perspective view of one embodiment of the invention showing the side exhaust fan filter chamber sheet metal 401, after bending, with six round voids 415-20, one rectangular void 410, a notch 411 cut into the sheet metal, the normally closed thermally activated switch TS1 with its mounting hardware, two long screws 421 and 422 and two nuts 423 and 424. The cable for connecting the normally closed thermally activated switch TS1 comprising 2 pin connectors P31 and P32 and 2 conductor cable LW32 are also shown.

Figure 25:
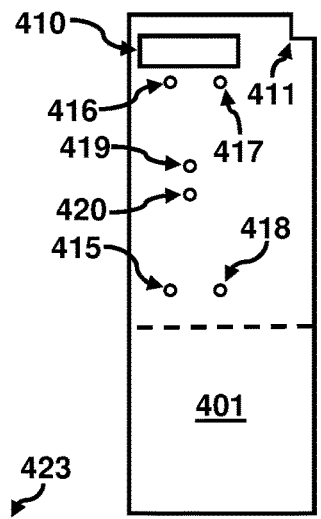
FIG. 25 shows a top view of the side exhaust fan filter chamber sheet metal prior to bending

FIG. 25 is a top view of one embodiment of the invention showing the side exhaust fan filter chamber sheet metal 401, before bending along the dashed line, with six round voids 415-20, one rectangular void 410 and a notch 411 cut into the sheet metal.

FIG. 26 is a top perspective rear view of one embodiment of the invention showing the top exterior sheet metal 100 the bottom exterior sheet metal 102, front pc board 500 and two normally open safety switches S5 and S6. The top exterior sheet metal 100 having dashed lines where the folded section of the top is not shown in this view and where two key shaped voids 125 and 126 are for the door locks 112 and 122 shown in FIG. 5 where the rectangular void 152 is the opening covered by the glass door 101, the two round voids 140 and 141 are the openings for the Power and Filter Light Emitting Diodes LED1 and LED2, the four square voids 146-9 are for the push button switches S1-4. The bottom exterior sheet metal 102 where the two key shaped voids 425-6 are for the door locks, the four round voids 431-4 are for mounting the normally open safety switches S5 and S6, the four long standoffs 435-8 are press fit into the bottom exterior sheet metal 102 for mounting the front pc board 500, the two round voids 440 and 441 are openings for the Power and Filter Light Emitting Diodes LED1 and LED2, the four square voids 446-9 are for the push button switches S1-4, the rectangular void 452 is the opening covered by the glass door 101. This view of the front pc board 500 shows the mounting screws 480-3, the Power and Filter Light Emitting Diodes LED1 and LED2 and ground fault interrupter module GFI1. The two normally open safety switches S5 and S6 are secured to the bottom exterior sheet metal 102 with four long screws 460-3 and four nuts 465-8.

FIG. 27 is a front and side view of one embodiment of the invention where the front view shows the front pc board 500 having four round voids 504-7 for mounting the front pc board 500 to the bottom exterior sheet metal 102 and four round voids 508-11 for mounting the ground fault interrupter module GFI1 to the front pc board 500 with four short screws 522-5. The tops of the Power and Filter Light Emitting Diodes LED1 and LED2 are shown in this view. Two of the four caps for the push button switches 142 and 143 are shown with the outline of normally open START and STOP switches S1 and S2 under the caps. The two square voids 514-5 are the for the two ground fault interrupter module GFI1 switches shown in FIG. 29.

The side view shows a detail of two of the four switches S1-2, two of the four caps for the push button switches 142 and 143, the front pc board 500 shows the overlap of the top exterior sheet metal 100 and the bottom exterior sheet metal 102.

FIG. 28 is a rear view of one embodiment of the invention showing the front pc board 500, normally open safety switches S5 and S6 and related connectors. The front pc board 500 shows three of the four round voids 504, 505 and 507 for mounting the front pc board 500 to the bottom exterior sheet metal 102 and the crimp lug 520 for grounding the ground fault interrupter module GFI1, four threaded voids 530-3 inside the ground fault interrupter module GFI1 shown with dotted lines for mounting the ground fault interrupter module GFI1 to front pc board 500 with four short screws 522-5 shown in FIG. 27. The 3 pin connectors J24 and J26 also shown with dotted lines and detailed in FIG. 29. The 2 pin connector J14 and the 8 pin connector J16 are shown with the copper conductors etched into the front pc board 500.

The 2 pin connector P14 plugs into 2 pin connector J14 shown with a dashed line. One of two wires LW14 from 2 pin connector P14 connects to 2 pin connector P15, the other wire LW11 connects to 2 pin connector P11, a third wire LW15 connects 2 pin connector P11 to 2 pin connector P15. The 2 pin connector P15 plugs into 2 pin connector J15 part of normally open safety switch S5 shown in the closed position by the action of the rotation of the right door lock 121 pushing the front door safety switch plunger 470 after closing the glass door 101, this position will allow the high voltage power to be turned ON only if all of the other safety devices are enabled. The 2 pin connector P11 plugs into 2 pin connector J11 part of normally open safety switch S6 shown in the open position by the action not rotating the right door lock 112 not pushing the front door safety switch plunger 475 after closing the glass door 101, this position will not allow the high voltage power to be turned ON regardless of the status of the other safety devices. The 8 pin connector P16 plugs into 8 pin connector J16 shown with a dashed line. An 8 conductor cable LW3 connects the 8 pin connector P16 to 8 pin connector P18 sending and receiving information to the main pc board 500 as shown in FIG. 38.

FIG. 29 are three side views of one embodiment of the invention where the top view shows the front pc board 500 where one of the four switch caps 144 is snapped on to the normally open switch S3 contained within the ground fault interrupter module GFI1. The 3 pin connector P26 plugs into 3 pin connector J26 with a 3 conductor cable PW2 connected to 3 pin connector P28 this supplies 110 volt power to the main pc board 700 as shown in FIG. 38.

The middle view shows the front pc board 500 with two of the four switch caps 144 and 145 snapped on to the normally open switch S3 and the two pole circuit breaker switch S4 contained within the ground fault interrupter module GFI1.

The bottom view shows the front pc board 500 where one of the four switch caps 145 is snapped on to the two pole circuit breaker switch S4 contained within the ground fault interrupter module GFI1. The 3 pin connector P24 plugs into 3 pin connector J24 and a 3 conductor cable PW2 connects 3 pin connector P24 to 3 pin power connector P1, a 110 volt power plug supplying external power to the IPD apparatus. A ground wire GW1 is also connected to 3 pin connector P24, the other end of this wire connects to crimp lug 520 grounding the bottom exterior sheet metal 102 with screw 481 and standoff 438 press fit into the bottom exterior sheet metal 102.

FIG. 30 is a top view of one embodiment the invention where the bottom exterior sheet metal 102, shown before bending along the dashed lines, showing the front pc board 500 the normally open safety switches S5 and S6, the high voltage transformer assembly XMR1, exhaust fan FAN1, main pc board 700, internal wiring and shown with dashed lines the top and side exhaust fan filter chamber sheet metal 400 and 401. The front pc board 500 has 2 pin connector P14 plugged into 2 pin connector P16 plugged into 8 pin connector J16, 3 pin connector P24 plugged into 3 pin connector J24, 3 pin connector P26 plugged into 3 pin connector J26, the ground fault interrupter module GFI1, and crimp lug 520. The normally open safety switch S5 has 2 pin connector P15 plugged into 2 pin connector J15. The normally open safety switch S6 has 2 pin connector P11 plugged into 2 pin connector J11. Normally closed thermally activated switch TS1 has 2 pin connector P31 plugged into 2 pin connector J31, the exhaust fan FAN1 has 2 pin connector P33 plugged into 2 pin connector J33. The 3 pin power connector P1 and 3 conductor cable PW1 pass thru a void 169 in the bottom exterior sheet metal 102.

The high voltage transformer assembly XMR1 has single pin high voltage connectors J2 and J3 and crimp lug 620 hard wired into secondary coil of wire L3, 2 pin connector P36 plugged into 2 pin connector J36 is hard wired into phase feedback coil of wire L2, 3 pin connector P38 plugged into 3 pin connector J38 is hard wired into the primary coil of wire L1 and connected to crimp lug 621 as shown in FIG. 32. The four round voids 601-4 in the laminated iron core 600 are for mounting the high voltage transformer assembly XMR1 to the bottom exterior sheet metal 102 and grounding the two crimp lugs 620 and 621. The current limiting air gap 605 in the laminated iron core 600 acts as a current limiting magnetic shunt preventing the primary coil of wire L1 from overheating when the secondary coil of wire L3 is operating in essentially a short circuit condition.

The main pc board 700 shows four round voids 706-9 for mounting the pc board to the bottom exterior sheet metal 102, a large round void 705 allows the long standoff 241 supporting the combustion chamber to pass thru. The 8 pin connector P18 is plugged into 8 pin connector J18, the 3 pin connector P28 is plugged into 3 pin connector J28, the 3 pin connector P38 is plugged into 3 pin connector J38, the 2 pin connector P32 is plugged into 2 pin connector J32, the 2 pin connector P34 is plugged into 2 pin connector J34, the 2 pin connector P36 is plugged into 2 pin connector J36, the 2 pin connectors J6, J8, J10 and J11 are shown without their matching connectors and wirers in this view and are described in FIG. 38.

FIG. 31 is a top view of one embodiment of the invention showing the high voltage transformer assembly TXMR1 where the laminated iron core 600 has four round mounting voids 601-4, single pin high voltage connectors J2 and J3 are hard wired into the secondary coil of wire L3 with wirers HW2 and HW3, crimp lug 620 is also hard wired into the center tap of the secondary coil of wire L3 with wirer GW3. The 2 pin connector P36 is hard wired into the phase feedback coil of wire L2 with wirers FW1 and FW2, The 3 pin connector P38 is hard wired to the primary coil of wire L1 with wirers NW2 and LW2 and connected to crimp lug 621 with wirer GW2. The four round voids 601-4 in the laminated iron core 600 are for mounting the high voltage transformer assembly XMR1 to the bottom exterior sheet metal 102 and grounding the two crimp lugs 620 and 621. The current limiting air gap 605 is described in FIG. 30.

FIG. 32 is a side perspective view of one embodiment of the invention showing the high voltage transformer assembly TXMR1 where the single pin high voltage connectors J2 and J3 are hard wired into the secondary coil of wire L3 with wirers HW2 and HW3. Crimp lug 620 is also hard wired into the center tap of the secondary coil of wire L3 with wirer GW3 and secured with nut 630 to the laminated iron core 600 and the long standoff 640 secured to the bottom exterior sheet metal 102 with short screw 650. The 2 pin connector P36 is hard wired into the phase feedback coil of wire L2 with wirers FW1 and FW2. The 3 pin connector P38 is hard wired into the primary coil of wire L1 with wirers NW2 and LW2 and connected to crimp lug 621 with wirer GW2. Crimp lug 621 is secured with nut 632 to the laminated iron core 600 and the long standoff 642 is secured to the bottom exterior sheet metal 102 with short screw 652. Nuts 631 and 633 are secure the laminated iron core 600 with the long standoff 641 and 643 are secured to the bottom exterior sheet metal 102 with short screws 651 and 653.

Figure 33:
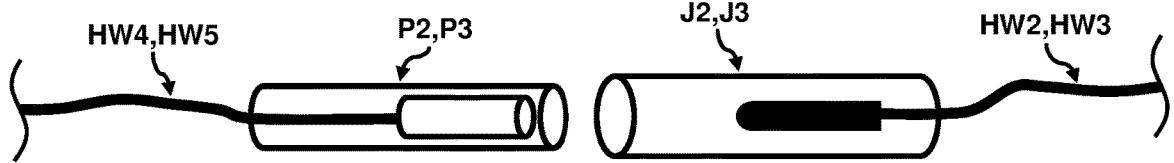
FIG. 33 shows a detailed view of the high voltage connectors.

FIG. 33 is a side view of one embodiment of the invention showing a detailed view of the single pin high voltage connectors J2 and J3 connected to wirers HW2 and HW3 and single pin high voltage connectors P2 and P3 are connected to wirers HW4 and HW5.

FIG. 34 is a top view of one embodiment of the invention showing the main pc board 700 showing the physical layout of the major components and mounting hardware where the four round voids 706-9 secure the main pc board 700 with four nuts 746-9 and four standoffs 776-9 press fit into the bottom exterior sheet metal 102. The large round void 705 allows the long standoff 241 supporting the combustion chamber to pass thru the main pc board 700. 710 is an aluminum heat sink. The relative positions of the solid state air flow sensor AF1, bridge rectifier BD1 containing D1-4, bridge rectifier BD2 containing D5-8, three 500 mf capacitors C1, C3, C5, two 1000 mf capacitors C2, C4, two field effect transistor FET1 and FET2, four amplifiers IC1-4, four integrated circuit digital to analog converters IC5-8, an integrated circuit analog to digital converter IC9, an integrated circuit field programmable gate array FPGA IC10, two under-voltage detectors IC11 and IC12, an over-voltage detector integrated circuit IC14, seven 2 pin connectors J6, J8, J10, J12, J32, J4, J36, two 3 pin connectors J28 and J38, an 8 pin connectors J18, two power relays RLY1-2, power transformer TMR2 and a 1 MHz oscillator crystal XTL1 are shown. A detailed description of the functionality will follow in FIG. 38.

FIG. 35 is a partial top perspective view of one embodiment of the invention showing the top exterior sheet metal 100 with the four square voids 180-3 intake vents. The arrows indicate the direction of the cool air being drawn into the IPD apparatus by FAN1.

FIG. 36 is a partial edge perspective view of one embodiment of the invention showing a corner of the main pc board 700 with mounting void 708, the physical layout the aluminum heat sink 710 and the 24 Volt negative voltage regulator VR3, the seven screws 720-6 and seven nuts 730-6 for mounting components to aluminum heat sink 710.

FIG. 37 is a side perspective view of one embodiment of the invention showing the solid state air flow sensor AF1. This solid state sensor is positioned in front of one of the four air intake vents, square void 183 cut into the top exterior sheet metal 100. The arrows indicate the direction of the air flow. When power is applied to the exhaust fan FAN1 the solid state air flow sensor AF1 generates an analog voltage output that goes up and down in proportion to the velocity of the air flow and is used to detect and control the operating status of the main pc board 700. A detailed description of the functionality will follow in FIG. 38.

FIG. 38 Is a schematic of one embodiment of the invention showing the front pc board 500, main pc board 700, two normally open safety switches S5 and S6, four electromagnetic containment coils of wire MC1-4, the high voltage transformer assembly TXMR1, the normally closed thermally activated switch TS1, the high voltage ignition module IM1 and the exhaust fan FAN1.

The integrated circuit field programmable gate array (FPGA) IC10 as shown in this embodiment is a pre-programmed single +5 volt power type performing multiple digital functions. The 1 MHz oscillator crystal XTL1 connected to FPGA IC10 is the timing source for the internal counters controlling the power ON and OFF sequence, powering the Power and Filter Light Emitting Diodes LED1 and LED2, duration of run time, detection and activation of the safety functions, the timed digital control of the amplitude of the four electromagnetic containment coils of wire MC1-4, receiving the digital output from and providing the clock to the integrated circuit 8 bit analog to digital converter IC9, providing the digital output and clock to the integrated circuit 8 bit digital to analog converters IC5-8 and turning ON and OFF the exhaust fan FAN1 and high voltage transformer assembly TXMR1.

When 3 pin power connector P1 is plugged into a 110 volt 60 Hz outlet power is delivered to the input of the ground fault interrupter module GFI1 via 3 conductor cable PW1, 3 pin connectors P24 and J24, and also connects to crimp lug 520 via ground wire GW1, this is the ground connection for the front pc board 500 and the top exterior sheet metal 100 and the bottom exterior sheet metal 102. The ground fault interrupter module GFI1 is an off the shelf module, the internal components are shown for reference, after the TEST normally open switch S3 has been pressed to open the internal circuit breaker contacts, or for safety if any outside contact is made with the high voltage components this will require the RESET two pole circuit breaker switch S4 to be pressed to close the internal circuit breaker contacts. The output of the ground fault interrupter module GFI1 connects to the 3 pin connector J28 via the 3 pin connector J26, the 3 pin connector P26, 3 conductor cable PW2, and the 3 pin connector P28. Pin 1 of the 3 pin connector J28 connects to one of the normally open switch contacts on power relays RLY1 and RLY2 and one end of the inputs of the power transformer TXMR2. Pin 2 of the 3 pin connector J28 connects to one end of the primary coil of wire L1 via pin 2 of the 3 pin connector J38, the 3 pin connector P38 and wire NW2 and also connects to exhaust fan FAN1 via connector pin 2 of the 2 pin connector J34, the 2 pin connector P34, 2 conductor cable LW33, the 2 pin connector P33, and pin 2 of the 2 pin connector J33. Pin 3 of the 3 pin connector J28 connects to crimp lug 621 via pin 3 of the 3 pin connector J38, the 3 pin connector P38 and wire GW2 grounding the laminated iron core 600 for the high voltage transformer assembly TXMR1 and is also the ground connection for main pc board 700. The other normally open switch contact on relay RLY2 connects to the other end of the primary coil of wire L1 via pin 1 of the 3 pin connector J38, the 3 pin connector P38 and wire LW2. The other normally open switch contact on power relay RLY1 connects to exhaust fan FAN1 via pin 1 of the 2 pin connector J34, the 2 pin connector P32, 2 conductor cable LW33, the 2 pin connector P33 and pin 1 of the 2 pin connector J33.

One output of the power transformer TXMR2 connects to bridge rectifier BD2 containing four diodes D5-8 charging 500 uF capacitor C3 supplying power to the input of the 24 Volt negative voltage regulator VR3, the output of the 24 Volt negative voltage regulator VR3 charges 1000 uF capacitor C4 supplying negative 24 volt power to the 24 volt negative power inputs to the four integrated circuit amplifiers IC1-4.

The other output of the power transformer TXMR2 connects to bridge rectifier BD1 containing diodes D1-4 charging 500 uF capacitor C1 supplying power to the input of the 24 Volt positive voltage regulator VR2, the output of the 24 Volt positive voltage regulator VR2 charges 1000 uF capacitor C2 supplying 24 volt power to the 5 Volt positive voltage regulator VR1, and the 24 volt positive power inputs to the four integrated circuit amplifiers IC1-4. The output of the +5 Volt positive voltage regulator VR1 charges 500 uF capacitor C5 supplying +5 volt power to integrated circuits IC5-13, solid state air flow sensor AF1, 10K ohm pull up resistors R1, R2 and R3 and one end of the coil of wire inside power relays RLY1 and RLY2. The other end of the coil of wire inside power relay RLY1 connects to field effect transistor FET1 which is held OFF via 10K ohm pull down resistor R4 connected to ground and turned ON via an output pin on FPGA IC10 turning ON the exhaust fan FAN1. The other end of the coil of wire inside power relay RLY2 connects to field effect transistor FET2 which is held OFF via 10K ohm pull down resistor R5 connected to ground and turned ON via an output pin on FPGA IC10 turning ON the high voltage transformer assembly TXMR1. All of the power connections on the voltage regulators VR1-3, integrated circuits IC1-13 and solid state air flow sensor AF1 have grounded 0.1 uF filter capacitors or similar not shown in the schematic.

The ground on front pc board 500 is connected to pin 1 on the 2 pin connector J15 of the normally open safety switch S5 via pin 1 on the 2 pin connector J14, plugged into 2 pin connector P14 with wire LW14 and 2 pin connector P15, plugged into pin 1 on the 2 pin connector J15 of the normally open safety switch S5. Pin 2 on the 2 pin connector J15 of the normally open safety switch S5 is connected to pin 1 on the 2 pin connector J11 of the normally open safety switch S6, via 2 pin connector P15 with wire LW15 and the 2 pin connector P11. Pin 2 on the 2 pin connector J11 of the normally open safety switch S6 is connected to pin 1 on the 2 pin connector J31 of the normally closed thermally activated switch TS1 via the 2 pin connector P11 with wire LW16 the 2 pin connector P14 plugged into pin 2 of the 2 pin connector J14 and pin 3 of the 8 pin connector J16 on front pc board 500 the 8 pin connector P16 with 8 conductor cable LW3 and the 8 pin connector P18 plugged into pin 3 on the 8 pin connector J18 connected to pin 1 of the 2 pin connector J32 on main pc board 700, plugged into 2 pin connector P32 with 2 conductor cable LW32 and the 2 pin connector P31. Pin 2 of the 2 pin connector J31 of the normally closed thermally activated switch TS1 is connected to an input pin on FPGA IC10 via the 2 pin connector P31 with the 2 conductor cable LW32, the 2 pin connectors P32 and 2 pin of the 2 pin connectors J32 on main pc board 700 with a 10K ohm pull up resistor R1. Pin 5 of the 8 pin connectors J16 and J18 are grounded.

The normally closed thermally activated switch TS1 remains closed unless the combustion chamber is overheated, normally open safety switches S5 and S6 are closed when the front glass door locks are locked, only when all three of the switches wired in series are closed the +5V from the 10K ohm pull up resistor R1 changes to a ground state at the input pin on FPGA IC10 enabling one part of the safety devices to turn on the high voltage transformer assembly TXMR1.

Pin 2 of the normally open power ON START switch S1 is connected to ground. Pin 1 of the normally open power ON START switch S1 is connected to an input pin on FPGA IC10 via pin 7 of the 8 pin connector J16 plugged into the 8 pin connector P16 with 8 conductor cable LW3 and the 8 pin connector P18 plugged into pin 7 of the 8 pin connector J18 on main pc board 700 with a 10K ohm pull up resistor R3. Pin 2 of the normally open power OFF STOP switch S2 is connected to ground. Pin 1 of the normally open power OFF STOP switch S2 is connected to an input pin on FPGA IC10 via pin 8 of the 8 pin connector J16 plugged into the 8 pin connector P16 with 8 conductor cable LW3 and the 8 pin connector P18 plugged into pin 8 of the 8 pin connector J18 on main pc board 700 with a 10K ohm pull up resistor R2.

Power and Filter Light Emitting Diodes LED1 and LED2 are tri-color meaning when power is applied to the anode leads marked G they light up Green and when power is applied to the anode leads marked R they light up Red and when power is applied to both the R and G leads they light up Yellow. The negative cathodes of the Power and Filter Light Emitting Diodes LED1 and LED2 are connected to Ground. The G lead on the Power Light Emitting Diode LED1 is connected to an output pin on FPGA IC10 via pin 2 of the 8 pin connector J16 plugged the 8 pin connector P16 with 8 conductor cable LW3 and 8 pin connector P18 plugged the pin 2 of the 8 pin connector J18 on main pc board 700. The R lead on the Power Light Emitting Diode LED1 is connected to an output pin on FPGA IC10 via pin 1 of the 8 pin connector J16 plugged the 8 pin connector P16 with 8 conductor cable LW3 and 8 pin connector P18 plugged the pin 1 of the 8 pin connector J18 on main pc board 700. The G lead on the Filter Light Emitting Diode LED2 is connected to an output pin on FPGA IC10 via pin 6 of the 8 pin connector J16 plugged the 8 pin connector P16 with 8 conductor cable LW3 and 8 pin connector P18 plugged the pin 6 of the 8 pin connector J18 on main pc board 700. The R lead on the Filter Light Emitting Diode LED2 is connected to an output pin on FPGA IC10 via pin 4 of the 8 pin connector J16 plugged the 8 pin connector P16 with 8 conductor cable LW3 and 8 pin connector P18 plugged the pin 4 of the 8 pin connector J18 on main pc board 700.

The LED Status Indications are:

| | |
|---|---|
| 1. LED1 Red | LED2 off: P1 plugged into 110 volt source: IPD OFF |
| 2. LED1 Green | LED2 Green: IPD ON |
| 4. LED1 Green | LED2 flashing Yellow: Replace air filter 300 soon, IPD ON |
| 5. LED1 flashing Yellow | LED2 flashing Red: Replace air filter 300 now, IPD OFF |
| 6. LED1 flashing Yellow | LED2 flashing Yellow: air filter 300 not installed, IPD OFF |
| 7. LED1 flashing Red | LED2 flashing Red: Any safety switch open, IPD OFF |

Solid state air flow sensor AF1 an off the shelf solid state device positioned in front of square void 183 an intake vent cut into the top exterior sheet metal 100. When exhaust fan FAN1 is ON the solid state air flow sensor AF1 generates an analog voltage output that goes up and down in proportion to the velocity of the air flow. This output is connected to the input pins of Over and Under Voltage Detectors IC11-3. Under Voltage Detector IC11 detects a reduced airflow indicating the air filter 300 needs to be replaced soon sending a +5 Volt signal to an input pin on FPGA IC10 which then sends a yellow flashing output to Light Emitting Diode LED2 but allows the IPD apparatus to continue to operate. Under Voltage Detector IC12 detects a further reduced airflow indicating the air filter 300 needs to be replaced, the glass door 101 or top exterior sheet metal 100 has been removed sending a +5 Volt signal to an input pin on FPGA IC10 which then sends a Yellow flashing output to the Power Light Emitting Diode LED1 and red flashing output to Filter Light Emitting Diode LED2 and the IPD apparatus will not turn ON or turns OFF. Over Voltage Detector IC13 detects a higher than normal airflow indicating the air filter 300 is not installed sending a +5 Volt signal to an input pin on FPGA IC10 which then sends a Yellow flashing output to the Power and Filter Light Emitting Diodes LED1 and LED2 and the IPD apparatus will not turn ON.

The center tap of secondary coil of wire L3 in the high voltage transformer assembly TXMR1 is grounded to the laminated iron core 600 by crimp lug 620 via wire GW3. When the high voltage transformer assembly TXMR1 is turned ON 110 volt 60 Hz power is supplied to L1 and high voltage from both ends of the secondary coil of wire L3 is supplied to the top and bottom discharge plates 200 and 210 forming the Ion Plasma arc 250 as shown in FIG. 13, one end via wire HW2, single pin high voltage connectors J2 and P2, wire HW4, and crimp lug 225, and the other end via wire HW3, single pin high voltage connectors J3 and P3, wire HW5, and crimp lug 226. In this embodiment each side of the secondary coil of wire L3 produces 5,000 volts that are in phase with each other resulting in a total differential at the top and bottom discharge plates 200 and 210 of 10,000 volts. If using the alternate ignition method described in FIG. 13 110 volt 60 Hz power is also supplied to the high voltage ignition module IM1 as shown with dotted lines.

The phase feedback coil of wire L2 in the high voltage transformer assembly TXMR1 provides a phase locked sine wave reference to the magnetic field generated by the Ion Plasma arc 250 shown in FIG. 13. To create a repelling force the magnetic fields generated by the four electromagnetic containment coils of wire MC1-4 as shown in FIG. 14 may need to be 90 degrees out of phase with the magnetic field generated by the Ion Plasma arc 250. This phase delay can be modified between 0 and 90 degrees to optimize performance. To accomplish this one end of the phase feedback coil of wire L2 in the high voltage transformer assembly TXMR1 is grounded to the main pc board 700 via wire FW1, 2 pin connector P36 and pin 2 pin of 2 pin connector J36. The other end of the phase feedback coil of wire L2 connects to 1 uF capacitor C20 via wire FW2, 2 pin connector P36 and pin 1 pin of 2 pin connector J36. The 1 uF capacitor C20 and 2.65K ohm resistor R20 derive the first stage 45 degree phase shift and connected in series with the 1 uF capacitor C21 and 2.65K ohm resistor R21 derive the second stage 45 degree phase shift comprising a passive 90 degree phase shift network tuned to the 60 Hz sine wave source frequency. The calculations for determining the values of these components are:

Definitions:
R=2,648.929 (2.65K) Resistance in ohms
C=0.000001 (1 uF) Capacitance in farads
f=60 (Hz) Frequency in cycles per second
$\pi$=the value of pi (will use 3.1415926 for calculations)
$\Phi$=phase delay in degrees
arctan=arctangent is the inverse tangent function
$\times$=times, /=divided by Where solving for the first stage R and pre-selecting a 1 uF capacitor:

$R = 1/2\pi fC$ $R = 1/2 \times 3.1415926 \times 60 \times 0.000001$ $R = 1/0.000377511$ R=2,648.9294351688 (shortened to 2,648.929 for the phase calculation and 2.65K for the actual component used for resistors R20 and R21)

Where solving for the first stage phase delay:

$$\arctan(1/2\pi fRC) = \phi$$

$$\arctan(1/2 \times 3.1415926 \times 60 \times 2{,}648.929 \times 0.000001) = \phi$$

$$\arctan(1/0.9986226893) = \phi$$

$$\arctan 1.0013792103 = \phi$$

$$\Phi = 45.0394842 \text{ degrees}$$

×2 for the second stage=90.0796855 degrees (90 degrees)

This 90 degree phase shifted 60 Hz source at the junction of 1 uF capacitor C21 and 2.65K resistor R21 is connected to the input of the 8 bit analog to digital converter IC9, the 8 bit output is connected to FPGA IC10 via the 8 connections shown on the right side of the 8 bit analog to digital converter IC9, the 1 MHz clock needed to digitize this analog sine wave is provided by an output pin on FPGA IC10 to the 8 bit analog to digital converter IC9 via the connection at the top of the 8 bit analog to digital converter IC9.

The digitized sine wave is routed thru FPGA IC10 to the four 8 bit analog to digital converter IC5-8 via 32 output pins shown connected to the left sides of the 8 bit analog to digital converter IC5-8, the 1 MHz clock needed to convert this digitized sine wave back to an analog output is provided by four output pins on FPGA IC10 connected to the four 8 bit analog to digital converters IC5-8 via the connection at the top of the four 8 bit analog to digital converters IC5-9. Each of the digital to analog converters IC5-8 receives a complete 8 bit digitized sine wave provided by the analog to digital converter IC9, the amplitude of this sine wave is individually and separately controlled by FPGA IC10 as described in FIG. 14 and shown in FIGS. 39-42.

To provide the power to drive the electromagnetic containment coil of wire MC1, as shown in FIG. 14, the analog output of the digital to analog converter IC5 is connected to the 1 Mf capacitor C6 via the output shown on the right side of the digital to analog converter IC5. The other side of the 1 Mf capacitor C6 connects to the positive input of amplifier IC1 and 1K ohm resistor R7 connected to ground. The negative input of the amplifier IC1 is connected to 10K ohm resistor R9 connected to the output of the amplifier IC1 and 1K ohm resistor R8 connected to ground. The output of the amplifier IC1 connects to one end of the electromagnetic containment coils of wire MC1 via pin 2 of the 2 pin connector J6, 2 pin connector P6 and wire LW6. The other end of the electromagnetic containment coils of wire connects to ground via wire LW5, the 2 pin connector P6 and pin 1 of the 2 pin connector J6.

To provide the power to drive the electromagnetic containment coil of wire MC2, as shown in FIG. 14, the analog output of the digital to analog converter IC6 is connected to the 1 Mf capacitor C7 via the output shown on the right side of the digital to analog converter IC6. The other side of the 1 Mf capacitor C7 connects to the positive input of amplifier IC2 and 1K ohm resistor R10 connected to ground. The negative input of amplifier IC2 is connected to 10K ohm resistor R12 connected to the output of the amplifier IC2 and 1K ohm resistor R11 connected to ground. The output of the amplifier IC2 connects to one end of the electromagnetic containment coils of wire MC2 via pin 2 of 2 pin connector J8, 2 pin connector P8 and wire LW8. The other end of the electromagnetic containment coils of wire MC2 connects to ground via wire LW7, the 2 pin connector P8 and pin 1 of the 2 pin connector J8.

To provide the power to drive the electromagnetic containment coil of wire MC3, as shown in FIG. 14, the analog output of the digital to analog converter IC7 is connected to the 1 Mf capacitor C8 via the output shown on the right side of the digital to analog converter IC7. The other side of the 1 Mf capacitor C8 connects to the positive input of amplifier IC3 and 1K ohm resistor R13 connected to ground. The negative input of amplifier IC3 is connected to 10K ohm resistor R15 connected to the output of amplifier IC3 and 1K ohm resistor R14 connected to ground. The output of amplifier IC3 connects to one end of the electromagnetic containment coil of wire MC3 via pin 2 of the 2 pin connector J10, the 2 pin connector P10 and wire LW10. The other end of the electromagnetic containment coil of wire MC3 connects to ground via wire LW9, the 2 pin connector P10 and pin 1 of the 2 pin connector J10.

To provide the power to drive the electromagnetic containment coil of wire MC4, as shown in FIG. 14, the analog output of the digital to analog converter IC8 is connected to the 1 Mf capacitor C9 via the output shown on the right side of the digital to analog converter IC8. The other side of the 1 Mf capacitor C9 connects to the positive input of amplifier IC4 and 1K ohm resistor R16 connected to ground. The negative input of amplifier IC4 is connected to 10K ohm resistor R18 connected to the output of amplifier IC4 and 1K ohm resistor R17 connected to ground. The output of amplifier IC4 connects to one end of the electromagnetic containment coil of wire MC4 via pin 2 of the 2 pin connector J12, the 2 pin connector P12 and wire LW12. The other end of the electromagnetic containment coil of wire MC4 connects to ground via wire LW11, the 2 pin connector P12 and pin 1 of the 2 pin connector J12.

After inserting a document and closing the door handles the sequence of events for normal operation upon pressing the normally open power ON START switch S1 is as follows:

1. Verify the normally open safety switches S5 and S6 and normally closed thermally activated switch TS1 are closed.

2. Close power relay RLY1 starting exhaust fan FAN1.

3. Verify the air flow information from the solid state air flow sensor AF1 is within tolerance.

4. Close power relay RLY2 providing power to the high voltage transformer TXMR1.

5. Change the Power Light Emitting Diode LED1 from Red to Green and turn ON the Filter Light Emitting Diode LED2 in Green.

5. Start an internal 2 minute timer in FPGA IC10.

6. Start the 4 cycles of the pre-programmed 30 second search pattern powering the electromagnetic containment coil of wire MC1-4.

7. After 2 minutes open power relay RLY2 turning power OFF to the high voltage transformer assembly TXMR1 and stop power to the electromagnetic containment coil of wire MC1-4.

8. Start 30 second timer in FPGA IC10 before opening power relay RLY1 stopping the exhaust fan FAN1.

9. Change the Power Light Emitting Diode LED1 from Green to Red and turn OFF the Filter Light Emitting Diode LED2.

The sequence of events upon pressing the normally open power OFF STOP switch S2 before the normal operating sequence is completed is as follows:

1. Open power relay RLY2 turning power OFF to the high voltage transformer assembly TXMR1 and stop power to the electromagnetic containment coil of wire MC1-4.
2. Start 30 second timer in FPGA IC10 before opening power relay RLY1 stopping the exhaust fan FAN1.
3. Change the Power Light Emitting Diode LED1 from Green to Red and turn OFF the Filter Light Emitting Diode LED2.

Any faults in the START sequence will result in execution of the STOP sequence and the fault will be indicated by the LED status lights as previously listed above in this FIG. 38 section.

Figure 39:
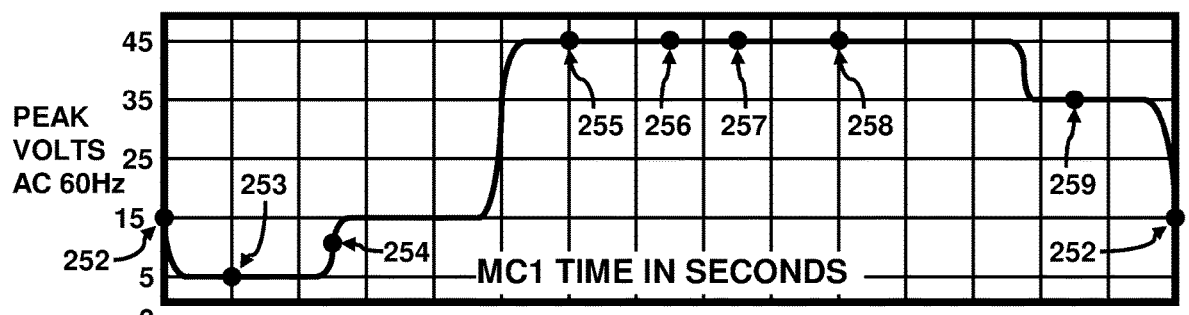
FIG. 39 shows a representation of the amplitude of the phase locked output of the amplifier driving electromagnetic containment coil of wire MC1 over a thirty second period of time.

FIG. 39 is a graphic representation of one embodiment of the invention showing the peak amplitude in Volts AC, between a minimum of 5 Volts and maximum of 45 Volts at a frequency of 60 Hz, of the output of amplifier IC1 providing power to electromagnetic containment coil of wire MC1 with a waveform pattern that will repeat every 30 seconds. The nine indicated reference points 252-9, 252 reflect the position, between the top and bottom discharge plates 200 and 210, of the Ion Plasma arc 250 as shown in FIG. 14 and detailed in previous section FIG. 38. Reference point 252 is shown twice once at 0 seconds and once at 30 seconds where the pattern repeats. A detailed description of the interaction of the four electromagnetic containment coils of wire MC1-4 will follow.

Figure 40:
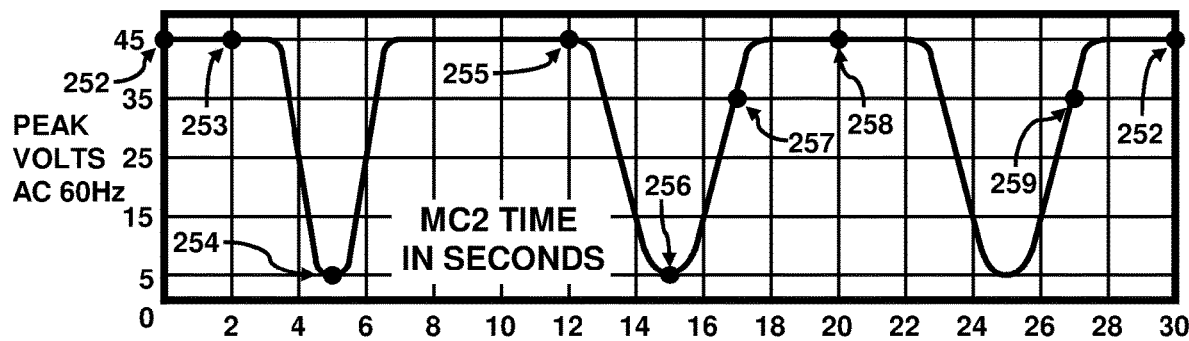
FIG. 40 shows a representation of the amplitude of the phase locked output of the amplifier driving electromagnetic containment coil of wire MC2 over a thirty second period of time.
Figure 41:
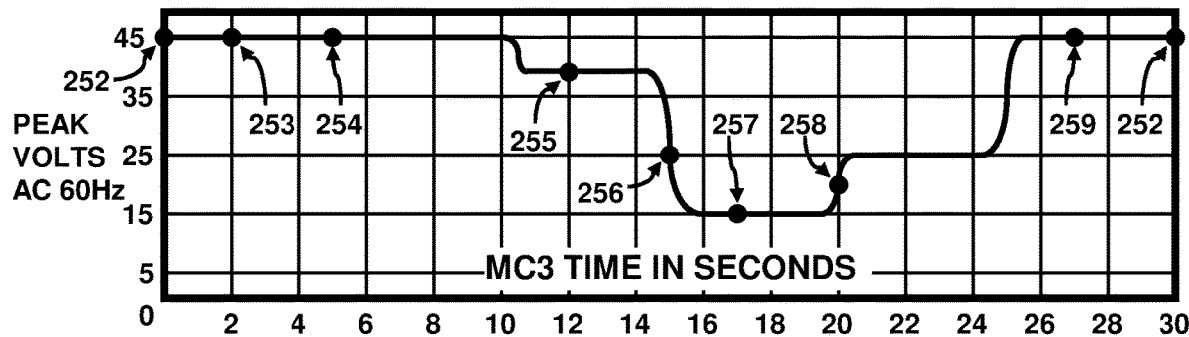
FIG. 41 shows a representation of the amplitude of the phase locked output of the amplifier driving electromagnetic containment coil of wire MC3 over a thirty second period of time.

FIG. 40 is a graphic representation of one embodiment of the invention showing the peak amplitude in Volts AC, between a minimum of 5 Volts and maximum of 45 Volts at a frequency of 60 Hz, of the output of amplifier IC2 providing power to electromagnetic containment coil of wire MC2 with a waveform pattern that will repeat every 30 seconds. The nine indicated reference points 252-9, 252 reflect the position, between the top and bottom discharge plates 200 and 210, of the Ion Plasma arc 250 as shown in FIG. 14 and detailed in previous section FIG. 38. Reference point 252 is shown twice once at 0 seconds and once at 30 seconds where the pattern repeats. A detailed description of the interaction of the four electromagnetic containment coils of wire MC1-4 will follow.

FIG. 41 is a graphic representation of one embodiment of the invention showing the peak amplitude in Volts AC, between a minimum of 15 Volts, this higher minimum to compensate for the air flow between the plates, and maximum of 45 Volts at a frequency of 60 Hz, of the output of amplifier IC3 providing power to electromagnetic containment coil of wire MC3 with a waveform pattern that will repeat every 30 seconds. The nine indicated reference points 252-9, 252 reflect the position, between the top and bottom discharge plates 200 and 210, of the Ion Plasma arc 250 as shown in FIG. 14 and detailed in previous section FIG. 38. Reference point 252 is shown twice once at 0 seconds and once at 30 seconds where the pattern repeats. A detailed description of the interaction of the four electromagnetic containment coils of wire MC1-4 will follow.

Figure 42:
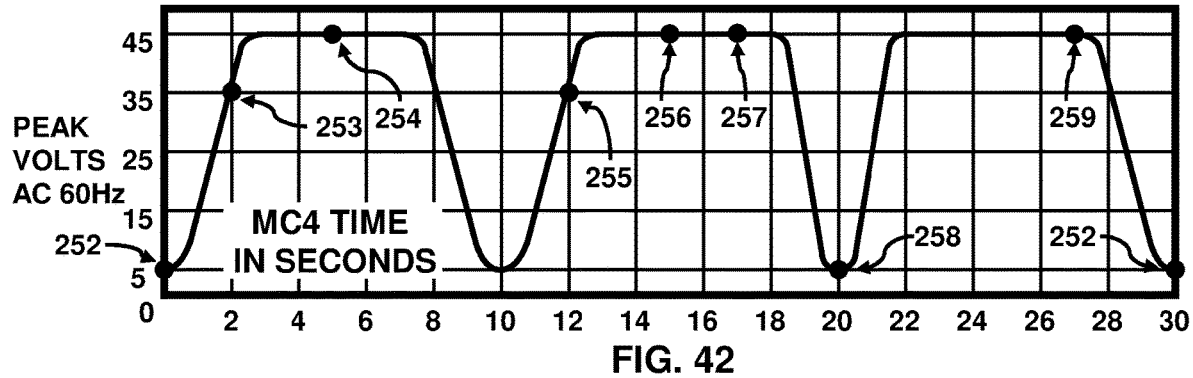
FIG. 42 shows a representation of the amplitude of the phase locked output of the amplifier driving electromagnetic containment coil of wire MC4 over a thirty second period of time.

FIG. 42 is a graphic representation of one embodiment of the invention showing the peak amplitude in Volts AC, between a minimum of 5 Volts and maximum of 45 Volts at a frequency of 60 Hz, of the output of amplifier IC4 providing power to electromagnetic containment coil of wire MC4 with a waveform pattern that will repeat every 30 seconds. The nine indicated reference points 252-9, 252 reflect the position, between the top and bottom discharge plates 200 and 210, of the Ion Plasma arc 250 as shown in FIG. 14 and detailed in previous section FIG. 38. Reference point 252 is shown twice once at 0 seconds and once at 30 seconds where the pattern repeats. A detailed description of the interaction of the four electromagnetic containment coils of wire MC1-4 will follow.

The interactions the four electromagnetic containment coils of wire MC1-4 are in pairs where MC1 and MC3 exert a repelling force on the Ion Plasma arc 250 pushing from front to rear and MC2 and MC4 pushing the Ion Plasma arc 250 from side to side, between the top and bottom discharge plates 200 and 210 as shown in FIG. 14. When either pair of coils of wire is at maximum voltage the Ion Plasma arc 250 will be centered between that pair of coils of wire. Movement is created by reducing the voltage on one or the other coils of wire in a pair while maximum voltage is maintained on the opposite coil. A minimum voltage is retained to contain the Ion Plasma arc 250 within the boundaries of the plates. A higher minimum voltage is retained on the electromagnetic containment coil of wire MC3 to compensate for the air flow from the front to the rear of the plates.

At the 0 seconds start of the 30 second pattern the Ion Plasma arc 250 at reference point 252 is positioned close to the front by the electromagnetic containment coil of wire MC1 at 15 Volts and the electromagnetic containment coil of wire MC3 at maximum 45 Volts and pushed to the far right by the electromagnetic containment coil of wire MC2 at maximum 45 Volts and the electromagnetic containment coil of wire MC4 at minimum 5 Volts.

At 2 seconds the voltage level of the electromagnetic containment coil of wire MC1 falls to 5 Volts, the electromagnetic containment coil of wire MC3 stays at maximum 45 Volts, the electromagnetic containment coil of wire MC2 stays at maximum 45 Volts and the electromagnetic containment coil of wire MC4 rises to 35 Volts, moving the Ion Plasma arc 250 to the front right at reference point 253.

At 5 seconds the voltage level of the electromagnetic containment coil of wire MC1 rises to 10 Volts, the electromagnetic containment coil of wire MC3 stays at maximum 45 Volts and the electromagnetic containment coil of wire MC2 falls to minimum 5 Volts and the electromagnetic containment coil of wire MC4 rises to 45 Volts, moving the Ion Plasma arc 250 to the far right and close to the front at reference point 254.

At 12 seconds the voltage level of the electromagnetic containment coil of wire MC1 is at maximum 45 Volts, the electromagnetic containment coil of wire MC3 is at 40 Volts, the electromagnetic containment coil of wire MC2 is at maximum 45 Volts and the electromagnetic containment coil of wire MC4 is at 35 Volts, positioning the Ion Plasma arc 250 slightly to the right and rear at reference point 255.

At 15 seconds the voltage level of the electromagnetic containment coil of wire MC1 is at maximum 45 Volts, the electromagnetic containment coil of wire MC3 is at 25 Volts, the electromagnetic containment coil of wire MC2 is at minimum 5 Volts and the electromagnetic containment coil of wire MC4 is at maximum 45 Volts, positioning the Ion Plasma arc 250 far to the left and close to the rear at reference point 256.

At 17 seconds the voltage level of the electromagnetic containment coil of wire MC1 stays at maximum 45 Volts, the electromagnetic containment coil of wire MC3 falls to minimum 15 Volts and the electromagnetic containment coil of wire MC2 rises to 35 Volts and the electromagnetic containment coil of wire MC4 stays at maximum 45 Volts, moving the Ion Plasma arc 250 to the left and far rear at reference point 257.

At 20 seconds the voltage level of the electromagnetic containment coil of wire MC1 stays at maximum 45 Volts, the electromagnetic containment coil of wire MC3 rises to 20 Volts and the electromagnetic containment coil of wire MC2 rises to 45 Volts and the electromagnetic containment coil of wire MC4 falls to minimum 5 Volts, moving the Ion Plasma arc 250 to the far right and close to the rear at reference point 258.

At 27 seconds the voltage level of the electromagnetic containment coil of wire MC1 is at 35 Volts, the electromagnetic containment coil of wire MC3 is at maximum 45 Volts, the electromagnetic containment coil of wire MC2 is at 35 Volts and the electromagnetic containment coil of wire MC4 is at maximum 45 Volts, positioning the Ion Plasma arc 250 slightly to the left and front at reference point 259.

At 30 seconds the voltage level of the electromagnetic containment coil of wire MC1 falls to 15 Volts, the electromagnetic containment coil of wire MC3 stays at maximum 45 Volts, the electromagnetic containment coil of wire MC2 rises to maximum 45 Volts and the electromagnetic containment coil of wire MC4 falls to minimum 5 Volts, positioning the Ion Plasma arc 250 far to the right and close to the front at reference point 252. This is the same reference point as 0 seconds and the start of the repeating pattern.

In this embodiment to maximize the coverage, better insure the Ion Plasma arc 250 will first ignite the front of a document placed in the IPD apparatus, and minimize the time to cover most of the area between the top and bottom discharge plates 200 and 210 the pattern is asymmetrical, this is apparent in the sharper corners of the pattern in the lower left at reference point 254 and upper right at reference point 258 corners, as shown in FIG. 14, and reflected by the narrower and wider curves in the waveforms as shown in FIG. 40 and FIG. 42.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while steps are presented in a given order, alternative embodiments may perform routines having steps in a different order. The teachings of the invention provided herein can be applied to other systems, not only the systems described herein. The various embodiments described herein can be combined to provide further embodiments. These and other changes can be made to the invention in light of the detailed description.

All the above references and U.S. patents and applications are incorporated herein by reference. Aspects of the invention can be modified, if necessary, to employ the systems, functions and concepts of the various patents and applications described above to provide yet further embodiments of the invention.

These and other changes can be made to the invention in light of the above detailed description. In general, the terms used in the following claims, should not be construed to limit the invention to the specific embodiments disclosed in the specification, unless the above detailed description explicitly defines such terms. Accordingly, the actual scope of the invention encompasses the disclosed embodiments and all equivalent ways of practicing or implementing the invention under the claims.

While certain aspects of the invention are presented below in certain claim forms, the inventors contemplate the various aspects of the invention in any number of claim forms.

What is claimed is:

1. An Ion plasma disintegration apparatus for disintegrating a document, the apparatus comprising:
   a) an exterior sheet metal case comprising intake and exhaust vent openings for exchanging air from an inside of the exterior sheet metal case to an outside of the exterior sheet metal case and an opening to insert the document in the exterior sheet metal case;
   b) a glass front door attached to the exterior sheet metal case, the glass front door configured to shift between a locked state and an opened state, wherein the apparatus further comprises a hinge and a plurality of locking handles for facilitating shifting of the glass front door between the locked state and the opened state, and wherein in the opened state, the glass front door provides access to a user to insert the document in the exterior sheet metal case through the opening;
   c) a sheet metal combustion chamber comprising a top combustion chamber sheet metal and a bottom combustion chamber sheet metal, wherein the sheet metal combustion chamber is mounted inside the exterior sheet metal case by a plurality of screws;
   d) a top discharge plate and a bottom discharge plate bonded to the top combustion chamber sheet metal and the bottom combustion chamber sheet metal, respectively, using a plurality of screw threads and a plurality of high voltage insulators, wherein the top discharge plate and the bottom discharge plate comprise an area to receive the document therebetween, wherein the top discharge plate and the bottom discharge plate are configured to generate an Ion plasma arc therebetween, and wherein each of the top discharge plate and the bottom discharge plate comprise a plurality of undulating ribs running from a front of the plates to a rear of the plates;
   e) a plurality of electromagnetic containment coils of wire surrounding the top and bottom discharge plates, the plurality of electromagnetic containment coils configured to provide a direction of travel to the generated Ion Plasma arc by interaction of magnetic fields generated by the plurality of electromagnetic containment coils;
   f) a high voltage transformer assembly connected to each of the top and bottom discharge plates by one or more single pin high voltage connectors, one or more wire, one or more crimp lugs, and at least one of the plurality of high voltage insulators, the high voltage transformer assembly being configured to provide a high voltage power to the top and bottom discharge plates, facilitating generation of the Ion Plasma arc between the top and bottom discharge plates, thereby creating the heat required to vaporize the document placed between the top and bottom discharge plates;
   g) a high voltage ignition module located under the bottom discharge plate, the high voltage ignition module configured to provide a low current high voltage pulse to create an electric spark between the top and bottom discharge plates, facilitating generation of the Ion Plasma arc between the top and bottom discharge plates, thereby creating the heat required to vaporize the document placed between the top and bottom discharge plates;
   h) a replaceable air filter configured to remove odor and smoke particles from the exterior sheet metal case;
   i) an exhaust fan mounted to the exterior sheet metal case, the exhaust fan configured to provide an air flow inside the exterior sheet metal case to keep clean air in contact with the glass front door to prevent darkening of an inner surface of the glass door and to pull all smoke through the air filter;

j) an exhaust fan chamber and an air filter cover disposed adjacent the sheet metal combustion chamber, the exhaust fan filter chamber being configured to house the exhaust fan, and the air filter cover being configured to mount the air filter to the exterior sheet metal case;

k) a thermally activated switch mounted adjacent the exhaust fan chamber and the sheet metal combustion chamber, the thermally activated switch being configured to protect the sheet metal combustion chamber from overheating;

l) a plurality of normally open safety switches mounted to the exterior sheet metal case, the safety switches being configured to provide status information regarding a state of the glass door, at least prior to turning on of any one of the high voltage transformer assembly and the high voltage ignition module;

m) a front pc board mounted to the exterior sheet metal case, the front pc board comprising: a Start switch to start a process of disintegration of the document, a Stop switch to stop the process of disintegration of the document, a ground fault interrupter module GFI, a Test switch to test the ground fault interrupter GFI, Reset switch to reset the ground fault interrupter GFI, a Power tricolor LED status light to show a status of the apparatus, and a Filter tricolor LED status light to show a status of the air filter; and n) a main pc board mounted to the exterior sheet metal case using a plurality of threaded screws, the main pc board configured to control the activation of the LED status lights, the exhaust fan, the high voltage transformer assembly, the high voltage ignition module, and the plurality of magnetic containment coils of wire;

wherein the apparatus is connected to an external 110 VAC power source with a corresponding 3 pin connector, 3 conductor cable, and 3 pin power connector, wherein the external power flows through the ground fault interrupter module and the ground fault interrupter module is connected to the main pc board with a corresponding 3 pin connector, 3 conductor cable, and 3 pin connector, wherein the two normally open safety switches are connected to the main pc board with corresponding wires and 2 pin connector, wherein the safety switches and the LED status lights are connected to the main pc board with a corresponding 8 pin connector, 8 conductor wire, and 8 pin connector.

2. The apparatus of claim 1, wherein the exterior sheet metal case comprises a top exterior sheet metal and a bottom exterior sheet metal, the top exterior sheet metal being secured to the bottom exterior sheet metal by a plurality of screws so as to define the exterior sheet metal case.

3. The apparatus of claim 1, wherein said front pc board is configured to provide means for an operator to turn on and off the apparatus and test and reset the ground fault interrupter module.

4. The apparatus of claim 1, wherein the Power LED status light is:
(a) Red when the apparatus is in a standby mode,
(b) Green for any one of the following conditions:
   when the apparatus is in operation; and
   when the air filter is in need of replacement;
(c) flashing Yellow for any one of the following conditions:
   air is entering from other than the plurality of intake vents,
   if the air filter is not installed; and
   a quality of the air filter is reduced; and
(d) flashing Red when any of the safety switches are open.

5. The apparatus of claim 4, wherein the Filter LED status light is:
(a) off in the standby mode,
(b) Green when the device is in operation,
(c) flashing Yellow for any one of the following conditions:
   when the air filter is not installed;
   air is entering from other than the plurality of intake vents, and
   when the air filter is in need of replacement; and
(d) flashing Red for any one of the following conditions:
   when the air filter is in need of replacement; and
   when any of the safety switches are open.

6. The apparatus of claim 5, wherein the apparatus further comprises an air flow sensor positioned in front of any one of the intake vent openings of the exterior sheet metal case, the air flow sensor configured to generate an analog voltage output in proportion to the velocity of the air flow and provide the generated voltage to the main pc board to detect reduced air flow, thereby indicating need of replacement of the air filter.

7. The apparatus of claim 1, wherein the exhaust fan is further configured to provide the air circulation within the exterior sheet metal case.

8. The apparatus of claim 1, wherein the plurality of high voltage insulators are configured to isolate the top and bottom discharge plates from the sheet metal combustion chamber and the exterior sheet metal case.

9. The apparatus of claim 1, wherein when the document is placed between the top and bottom discharge plates and at least one of the high voltage transformer assembly and the high voltage ignition module, controlled by the main pc board, provides power to the top and bottom discharge plates, the plurality of electromagnetic containment coils of wire are configured to move the Ion plasma arc between the top and bottom discharge plates such that contact of the Ion plasma arc with said document causes the document to burn so as to form ash.

10. The apparatus of claim 9, wherein subsequent to the contact of the Ion plasma arc with said document to cause the document to burn so as to form ash, the Ion plasma arc causes the ash to vaporize.

11. The apparatus of claim 9, wherein the plurality of electromagnetic containment coils of wire are configured to move the Ion plasma arc, are further configured to direct the movement of the Ion Plasma arc by repelling the magnetic field created by the Ion Plasma arc, wherein each of the plurality of electromagnetic containment coils of wire are wound with fire resistant insulation and individually driven by a phase locked pre-programmed pattern to magnetically move the Ion plasma arc between a majority of the top and bottom discharge plates, wherein each of the plurality of containment electromagnetic coils of wire are configured to maintain a respective minimum magnetic field to contain the Ion plasma arc within borders of the top and bottom discharge plates, and wherein at least one of the plurality of containment electromagnetic coils of wire is configured to maintain a minimum filed higher than the minimum fields of the remaining plurality of containment electromagnetic coils of wire so as to compensate for the air flow within the exterior sheet metal case.

12. The apparatus of claim 1, wherein the plurality of undulating ribs of the top and bottom discharge plates are configured to increase the air flow and enhance the burning of the document placed between the top and bottom discharge plates.

13. The apparatus of claim 12, wherein the undulating ribs of the top and bottom discharge pates are positioned to maintain a uniform spacing between the top and bottom discharge plates in order to maintain a uniform temperature of the Ion Plasma Arc.

14. The apparatus of claim 2, wherein the exhaust fan is configured to draw hot air from the combustion chamber into the exhaust fan chamber and to a front of the air filter through an opening in the exhaust chamber, wherein the exhaust fan is further configured to draw cool air across a top of the combustion chamber through a slot in the exhaust chamber, wherein the drawn cool air mixes with the drawn hot air thereby protecting the air filter and preventing the top exterior sheet metal from overheating.

15. The apparatus of claim 14, wherein the bottom exterior sheet metal comprises a removable door configured to provide access to the air filter.

16. The apparatus of claim 1, wherein the thermally activated switch is configured to open during overheating, causing the high voltage transformer assembly to power off while maintaining power to the exhaust fan for a predefined period of time.

17. The apparatus of claim 1, wherein the main pc board is configured to be activated by activation of the Start switch and deactivated by activation of the Stop switch, wherein the main pc board is further configured to:
  verify if the thermally activated switch is closed,
  verify if the safety switches are closed,
  turn on the exhaust fan,
  turn off the exhaust fan,
  verify if the air flow sensor is within tolerance,
  receive phase delayed sine wave data,
  send individually amplitude controlled 90 degree phase delayed data to the electromagnetic containment coils of wire,
  turn on the high voltage transformer assembly via a power relay,
  change the colors of the LED status lights,
  turn off power to the high voltage transformer assembly,
  turn off power to the electromagnetic containment coils of wire.

18. An apparatus for vaporizing documents by use of an Ion Plasma arc, the apparatus comprising an exterior case and a pair of electrical discharge plates connected to a high voltage source, the high voltage source being configured to generate the Ion Plasma arc between the pair of electrical discharge plates, wherein the exterior case comprises an access door to insert the documents between the pair of electrical discharge plates, wherein the apparatus further comprises a combustion chamber mounted inside the exterior case and surrounding the pair of electric discharge plates, a plurality of electromagnetic containment coils of wire surrounding the pair of electric discharge plates to provide a direction of travel to the Ion Plasma arc by interaction of magnetic fields generated by the plurality of electromagnetic containment coils, an electronic circuit mounted in an inner surface of the exterior case to control the functional operation of the apparatus, and an exhaust fan mounted on a back of the exterior case to keep clean air in contact with the access door to prevent darkening of an inner surface of the access door.

19. The apparatus of claim 18, wherein the pair of electrical discharge plates includes a top electrical discharge plate and a bottom electrical discharge plate, wherein the apparatus further comprises a high voltage ignition module located under the bottom electrical discharge plate, the high voltage ignition module configured to initiate the Ion Plasma arc by providing a low current high voltage pulse sufficient to create an electric spark between the top and bottom electrical discharge plates, thereby creating heat required to vaporize documents placed between the top and bottom electrical discharge plates, wherein said electronic circuit executes pre-programmed control of the electromagnetic containment coils of wire to move by repelling the magnetic field generated by the Ion Plasma arc in a pattern covering an area of the top and bottom electrical discharge plates.

20. The apparatus of claim 18, wherein said electronic circuit is configured to detect faults with respect to opening and closing of the access door and with respect to a state of airflow from the exhaust fan.

21. The apparatus of claim 18, wherein the apparatus further comprises an air filter configured to remove smoke particles and odours from air flow generated by the exhaust fan, the air filter comprising a charcoal filtering element to remove the odour and a fiberglass filtering element to remove smoke particles.

22. An apparatus for disintegrating documents by use of an Ion Plasma arc, the apparatus comprising:
  a pair of electrical discharge plates to receive the documents therebetween; and
  a plurality of electromagnetic containment coils of wire surrounding the top and bottom discharge plates, the plurality of electromagnetic containment coils configured to generate magnetic fields and provide a direction of travel to the Ion Plasma arc such that contact of the Ion plasma arc with said documents causes the document to disintegrate,
  wherein each of the plurality of electromagnetic containment coils of wire are individually driven by a phase locked pre-programmed pattern to magnetically move the Ion plasma arc between the pair of electrical discharge plates.

23. The apparatus of claim 22, wherein the plurality of electromagnetic containment coils of wire are configured to direct the movement of the Ion Plasma arc by repelling the magnetic field created by the Ion Plasma arc, wherein each of the plurality of containment electromagnetic coils of wire are configured to maintain a respective minimum magnetic field to contain the Ion plasma arc within borders of the pair of electrical discharge plates.

* * * * *